(12) United States Patent
Hwang et al.

(10) Patent No.: US 7,714,323 B2
(45) Date of Patent: *May 11, 2010

(54) ORGANIC THIN FILM COMPRISING PYRENE DERIVATIVES

(75) Inventors: In Ho Hwang, Daejeon Metropolitan (KR); Hyeon Choi, Daejeon Metropolitan (KR); Min Jeong Lee, Seoul (KR); Dong Hoon Lee, Seoul (KR); Kong Kyeom Kim, Daejeon Metropolitan (KR); Jae Soon Bae, Daejeon Metropolitan (KR); Dae Woong Lee, Daejeon Metropolitan (KR); Jung Bum Kim, Daejeon Metropolitan (KR)

(73) Assignee: LG Chem. Ltd., Seoul (KR)

( * ) Notice: Subject to any disclaimer, the term of this patent is extended or adjusted under 35 U.S.C. 154(b) by 609 days.

This patent is subject to a terminal disclaimer.

(21) Appl. No.: 11/474,971

(22) Filed: Jun. 27, 2006

(65) Prior Publication Data
US 2007/0023749 A1    Feb. 1, 2007

(30) Foreign Application Priority Data
Jun. 30, 2005 (KR) .................. 10-2005-0057717
Nov. 11, 2005 (KR) .................. 10-2005-0107940

(51) Int. Cl.
*H01L 35/24* (2006.01)
*H01L 51/00* (2006.01)
(52) U.S. Cl. ................. 257/40; 257/E51.049
(58) Field of Classification Search ............ 257/40
See application file for complete search history.

(56) References Cited

U.S. PATENT DOCUMENTS

| | | | |
|---|---|---|---|
| 6,617,609 B2 | 9/2003 | Kelley et al. | |
| 6,639,281 B2 | 10/2003 | Kane et al. | |
| 6,821,811 B2 | 11/2004 | Hirakata et al. | |
| 7,244,516 B1 * | 7/2007 | Sakamoto et al. | 428/690 |
| 2004/0076853 A1 * | 4/2004 | Jarikov | 428/690 |
| 2005/0079385 A1 | 4/2005 | Nomura et al. | |

FOREIGN PATENT DOCUMENTS

| | | |
|---|---|---|
| JP | 2005-260094 | 9/2005 |
| JP | 2005260094 A * | 9/2005 |

OTHER PUBLICATIONS

Machine Translation of JP 2005-260094.*
Machine Translation of JP 2005-260094, Sep. 2005.*
"Complexes of Substituted Imidazoles with Chloranil", Japan Chemistry Journal, 94(4), 365-370, 1971.

* cited by examiner

*Primary Examiner*—Kenneth A Parker
*Assistant Examiner*—Anthony Ho
(74) *Attorney, Agent, or Firm*—McKenna Long & Aldridge LLP

(57) ABSTRACT

The present invention relates to an organic thin film transistor which includes an organic layer comprising an organic compound facilitating the ohmic contact between a semi-conducting layer and electrodes and serving as the semi-conducting layer.

The organic thin film transistor according to the present invention has excellent electric contact between the semiconductor layer and the source electrode/drain electrode, and thus can be widely used as components for electric/electronic devices. As a result, as the materials for the source electrode or the drain electrode in the organic thin film transistor, materials which are less expensive and excellent in processibility though they have a low work function as the materials can be used.

17 Claims, 10 Drawing Sheets

ORGANIC THIN FILM COMPRISING PYRENE DERIVATIVES

TECHNICAL FIELD

The present invention relates to an organic thin film transistor, more particularly, to an organic thin film transistor that includes an organic layer comprising an organic compound facilitating the ohmic contact between a semi-conducting layer and electrodes and serving as the semi-conducting layer.

This application claims the benefits of Korean Patent Application Nos. 10-2005-0057717 and 10-2005-0107940 filed on Jun. 30, 2005 and Nov. 11, 2005, respectively, in the Korean Intellectual Property Office, the disclosure of which is incorporated herein by reference in its entirety.

BACKGROUND ART

Thin film field-effect transistors (FETs) are the basic building blocks in the fields of microelectronics. These FETs have three electrodes (e.g., a source electrode, a drain electrode, and a gate electrode), an insulating layer, and a semi-conducting layer. The FET functions as a capacitor where the semi-conducting layer is a conducting channel between two electrodes, i.e., the source electrode and the drain electrode. The density of charge carriers in the channel is Adjusted by a voltage applied to the gate electrode, so that the electric charge flow between the source and the drain electrodes can be controlled by the voltage applied to the gate electrode.

Recently increasingly interest has focused on the development of FETs using organic semi-conducting materials. When using the organic semi-conducting materials in FETs, electronic devices can be manufactured by means of a printing method, such as screen-printing, ink-jet printing, or micro-contact printing. In addition, these materials can be processed at a much lower substrate temperature and with little or no vacuum involved, as compared with the typical inorganic semi-conducting materials. Therefore, electronic devices, including FETs, which use organic semi-conducting materials, can be easier and less costly to produce as compared with those using inorganic semi-conducting materials.

Different types of organic materials such as small molecule, polymers and oligomers have been studied for the uses as organic semi-conducting materials in FETs since the 1980s. With concerted effort in this area, the performance of the organic FET has improved from $10^{-5}$ cm$^2$/Vs to 1 cm$^2$/Vs in terms of charge carrier mobility in a FET (J. M. Shaw, P. F. Seidler, IBM J. Res. & Dev., Vol. 45, 3 (2001)). The performance of the organic thin film transistor is now in the level of comparable to that of an amorphous silicon transistor, so that organic thin film transistors can be applied to E-papers, smart cards and display devices.

Important electronic devices, which can be manufactured using semi-conducting organic materials, include organic light emitting diodes, organic solar cells, and organic transistors. In these devices, the electrical contact between the semi-conducting organic materials and the electrodes is crucial to improving the performance of these devices. For example, charge-carrier injection layers, such as hole-injection and electron-injection layers, are interposed between semi-conducting layers and electrodes to improve the performance of organic light emitting diodes. Even though the operation mode of the organic transistor is different from that of the organic light emitting diode, electrical contact between the semi-conducting layer and the source and drain electrodes has a profound effect upon the performance of the organic transistor.

It has been reported that the performance of the organic transistor depends upon the source/drain materials (Y. Y. Lin et al. Materials Research Society Symposium Proceedings (1996), 413(Electrical, Optical, and Magnetic Properties of Organic Solid State Materials III), 413-418. CODEN: MRSPDH ISSN: 0272-9172). According to this report, metals with high work functions (for example, Pd, Pt, and Au) showed excellent performance while metals (for example, Al) with relatively low work functions showed a significantly degraded performance. Therefore, metals with high work functions such as gold have been used for the source/drain electrodes in most organic transistors.

However, such the metals having high work functions, which are noble metals, are expensive and hard to process using industrial methods, thus restricting their application processes and application structures in the organic transistors.

DISCLOSURE

Technical Problem

Therefore, the present inventors have studied a method that is capable of improving the electrical contact between the semi-conducting layer and the source or drain electrode in the organic thin film transistor. Further, the present inventors have studied a method that uses an inexpensive material for the source electrode or the drain electrode of the organic thin film transistor. That is, they have studied on inexpensive materials which can be used even though the material has a low work function as the material for the source or drain electrode of the organic thin film transistor.

An advantage of the present invention is that it provides an organic thin film transistor that includes an organic layer comprising an organic compound facilitating the ohmic contact between a semi-conducting layer and electrodes and serving as the semi-conducting layer, a method of manufacturing the same, and an electronic device including the same.

Technical Solution

According to an aspect of this invention, an organic thin film transistor comprises a gate electrode, an insulating layer, a source electrode, a drain electrode, and at least one organic layer including a semi-conducting layer, wherein at least one of the organic layers comprises a compound represented by the following the formula 1. The organic layer comprising the compound represented by the formula 1 may be a semi-conducting layer or an organic layer which is separately formed from the semi-conducting layer, and is formed between the semi-conducting layer and at least one electrode of the source electrode and the drain electrode:

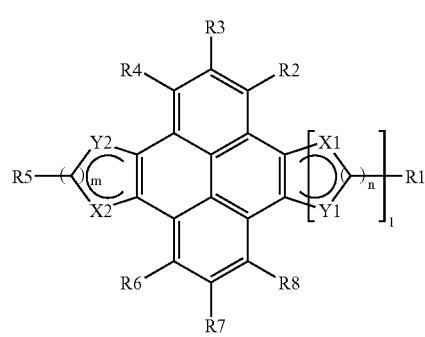

wherein m and n are each 1 or 2, l is 0 or 1,

X1 and X2 are each independently CH or N,

Y1 and Y2 are each independently NR0 in the case of n=1, and N in the case of n=2, wherein R0 is selected from the group consisting hydrogen, a substituted or unsubstituted alkyl group, and a substituted or unsubstituted aryl group, R1 to R8 are the same or different from each other, and are each independently selected from the group consisting of hydrogen, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, a nitrile group (—CN), a nitro group (—NO$_2$), a halogen group, an amide group (—NHCOR, —CONHR, —CONRR'), an ester group (—COOR), a sulfonyl group (—SO$_2$R), a sulfoxide group (—SOR), a sulfonamide group (—SO$_2$NRR'), a sulfonate group (—SO$_3$R), a trifluoromethyl group (—CF$_3$), an amine group (—NHR, —NRR'), and -L-M, and they may be bonded with an adjacent group to form an aromatic, aliphatic or heterocyclic fused ring, L is a $C_1$-$C_{60}$ alkylene group which is unsubstituted or substituted with at least one group selected from the group consisting of an amine group (—NHR, —NRR'), an amide group (—NHCOR, —CONHR, —CONRR'), an ether group (—COR) and an ester group (—COOR); a $C_6$-$C_{60}$ arylene group which is unsubstituted or substituted with at least one group selected from the group consisting of an amine group (—NHR, —NRR'), an amide group (—NHCOR, —CONHR, —CONRR'), an ether group (—COR) and an ester group (—COOR); or a 5- to 7-membered heterocyclic group which is unsubstituted or substituted with at least one group selected from the group consisting of an amine group (—NHR, —NRR'), an amide group (—NHCOR, —CONHR, —CONRR'), an ether group (—COR) and an ester group (—COOR), M is selected from the group consisting of an alcohol group (—OH), a thio group (—SH), a phosphate group (—PO$_3$H), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline, and R and R' are the same or different from each other, and are each independently hydrogen, a substituted or unsubstituted $C_1$-$C_{60}$ alkyl group, a substituted or unsubstituted $C_6$-$C_{60}$ aryl group, or a substituted or unsubstituted 5- to 7-membered heterocyclic group.

Preferably, R1 to R8 in the formula 1 are independently selected from substituted or unsubstituted electron withdrawing groups, which are well understood by those of ordinary skill in the art.

The compound of the formula 1 can be selected from the compounds represented by the following formula 2:

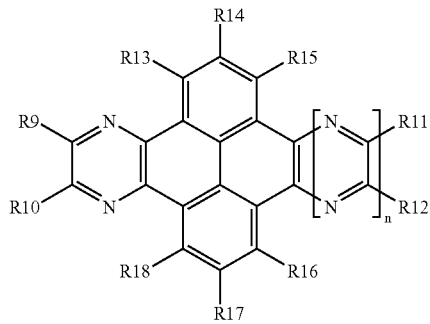

[2]

wherein n is 0 or 1,

R9 to R18 are each independently selected from the group consisting of hydrogen, a halogen group, a nitrile group (—CN), a nitro group (—NO$_2$), a sulfonyl group (—SO$_2$R), a sulfoxide group (SOR), a sulfonamide group (—SO$_2$NRR'), a sulfonate group (—SO$_3$R), a trifluoromethyl group (—CF$_3$), an ester group (CO—OR), an amide group (—CO—NHR, —CO—NRR'), a substituted or unsubstituted straight-chained or branched $C_1$-$C_{12}$ alkoxy group, a substituted or unsubstituted straight-chained or branched $C_1$-$C_{12}$ alkyl group, a substituted or unsubstituted aromatic or non-aromatic heterocyclic group, a substituted or unsubstituted $C_6$-$C_{20}$ aryl group, a substituted or unsubstituted amine group (—NHR, —NRR'), and -L-M, and R9 and R10, or R11 and R12 may be bonded together to form an aromatic or heterocyclic ring, L is a $C_1$-$C_{60}$ alkylene group which is unsubstituted or substituted with at least one group selected from the group consisting of an amine group (—NHR, —NRR'), an amide group (—NHCOR, —CONHR, —CONRR'), an ether group (—COR) and an ester group (—COOR); a $C_6$-$C_{60}$ arylene group which is unsubstituted or substituted with at least one group selected from the group consisting of an amine group (—NHR, —NRR'), an amide group (—NHCOR, —CONHR, —CONRR'), an ether group (—COR) and an ester group (—COOR); or a 5- to 7-membered heterocyclic group which is unsubstituted or substituted with at least one group selected from the group consisting of an amine group (—NHR, —NRR'), an amide group (—NHCOR, —CONHR, —CONRR'), an ether group (—COR) and an ester group (—COOR), M is selected from the group consisting of an alcohol group (—OH), a thio group (—SH), a phosphate group (—PO$_3$H), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline, and R and R' are the same or different from each other, and are each independently hydrogen, a substituted or unsubstituted $C_1$-$C_{60}$ alkyl group, a substituted or unsubstituted $C_6$-$C_{60}$ aryl group, or a substituted or unsubstituted 5- to 7-membered heterocyclic group.

Hereinafter, the substituents in the above formulae are explained in detail.

Examples of the aryl group of R0 to R18 in the above formulae include, but are not limited to, a phenyl group, a naphthyl group, an anthracenyl group, a tetracenyl group, a pentacenyl group, a biphenyl group, a terphenyl group, a benzyl group, a pyrenyl group, a perylenyl group, a coronenyl group, and the like.

Examples of the arylamine group of R1 to R18 in the above formulae include, but are not limited to, a diphenylamine group, a phenylnaphtylamine group, a ditolylamine group, a phenyltolylamine group, a carbazolyl group, a triphenylamine group, and the like.

Examples of the heterocyclic group of R1 to R18 in the above formulae include, but are not limited to, a pyridyl group, an acridinyl group, a thienyl group, an imidazolyl group, an oxazolyl group, a thiazolyl group, a quinolyl group, and the like.

Examples of the halogen group of R1 to R18 in the above formulae include fluorine, chlorine, bromine and iodine.

Examples of the silane group of R1 to R18 in the above formulae include, but are not limited to, a silole group, a silylene group, and the like. Examples of the halogen group of R1 to R18 in the above formulae include fluorine, chlorine, bromine and iodine.

In the case where the substituents of R1 to R18 in the above formulae contain other substituents, these substituent can selected from the group consisting of hydrogen, an alkyl group, an alkoxy group, an alkenyl group, an aryl group, an arylamine group, a heterocyclic group, a silane group, a boron group, an aliphatic cyclic group, an amino group, a nitrile group, a nitro group, a halogen group, an amide group, an ester group and an ether group.

Specific examples of the compound represented by the above formula 2 include, but are not limited to, the following compounds.

[2-1]

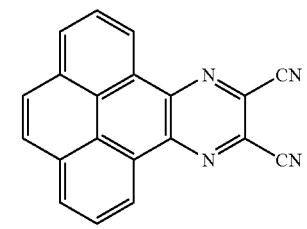

[2-2]

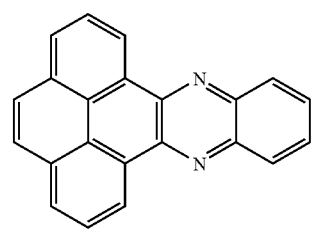

[2-3]

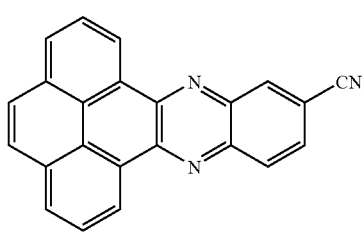

-continued

[2-4]

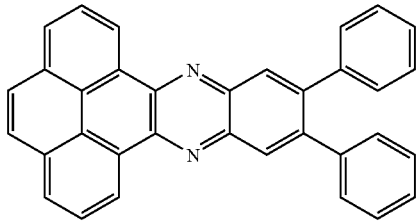

[2-5]

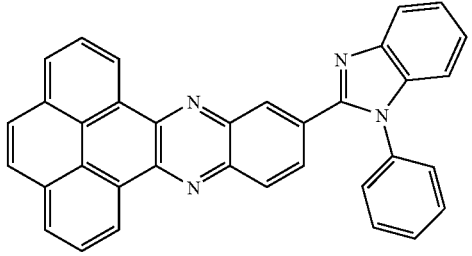

[2-6]

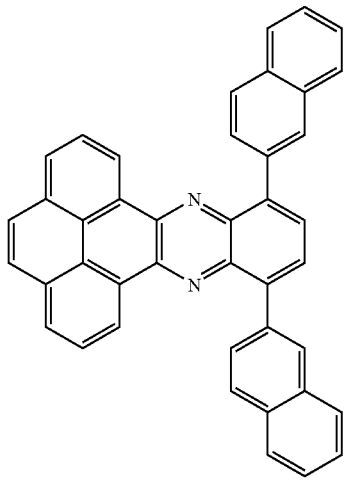

[2-7]

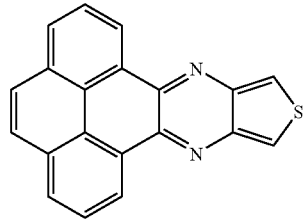

[2-8]

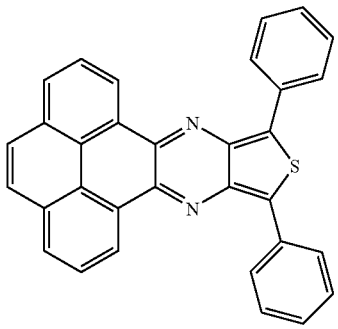

-continued
[2-9]
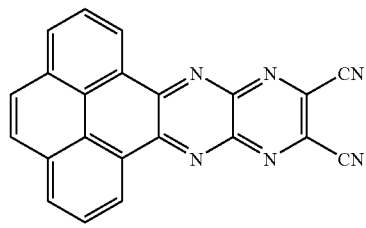
[2-10]
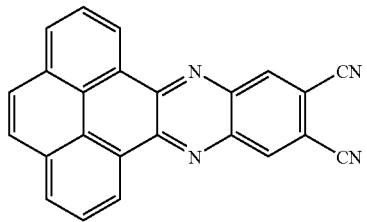
[2-11]
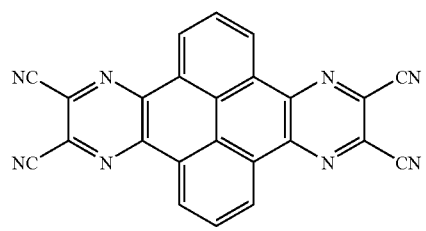
[2-12]
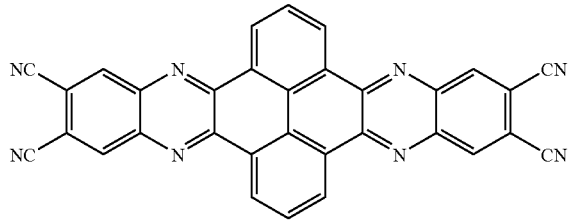
[2-13]
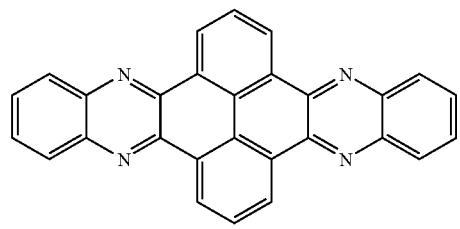
[2-14]
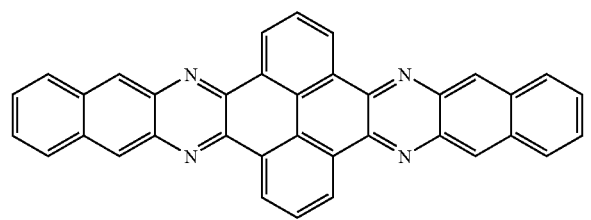
-continued
[2-15]
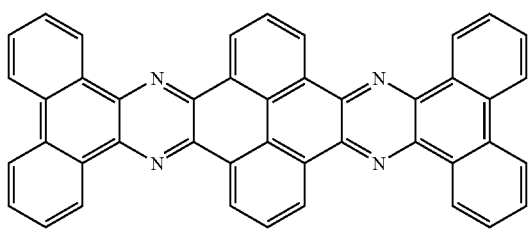
[2-16]
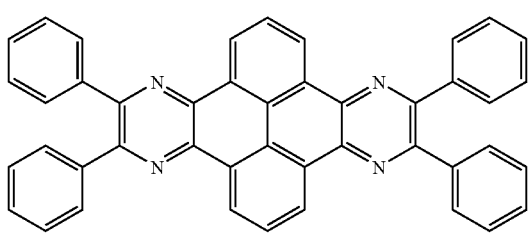
[2-17]
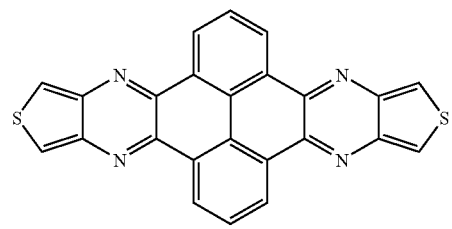
[2-18]
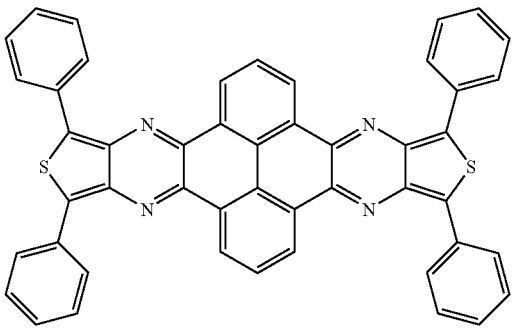
[2-19]
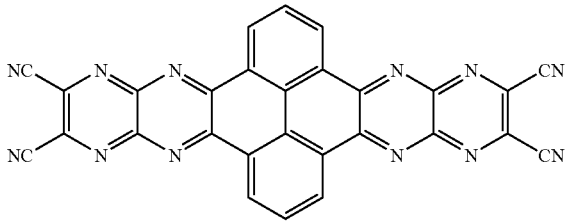
[2-20]
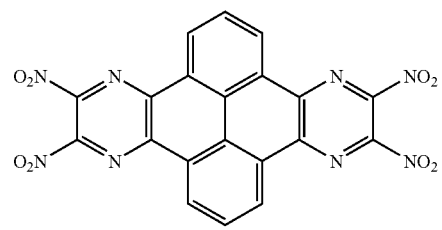

-continued
[2-21]
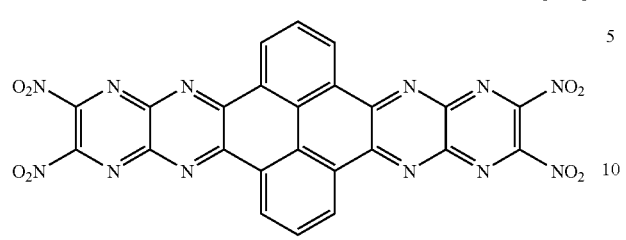
[2-22]
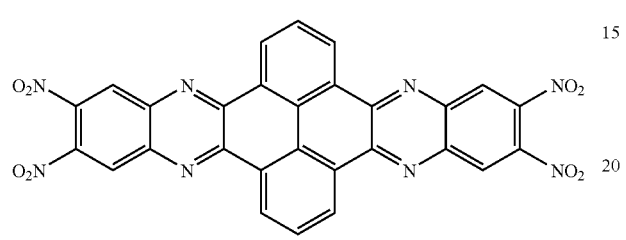
[2-23]
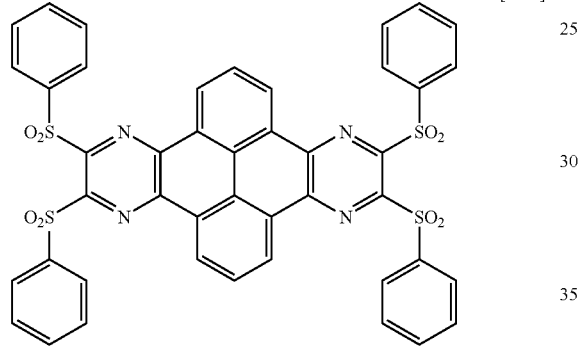
[2-24]
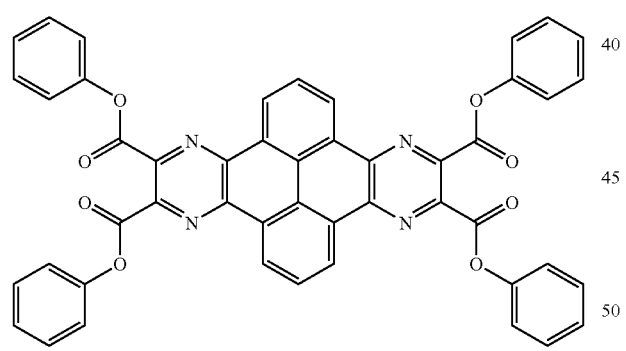
[2-25]
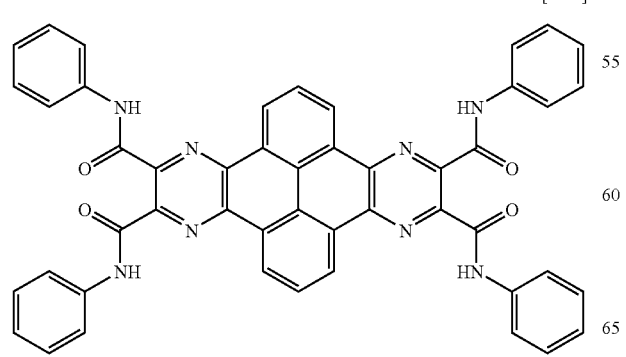
-continued
[2-26]
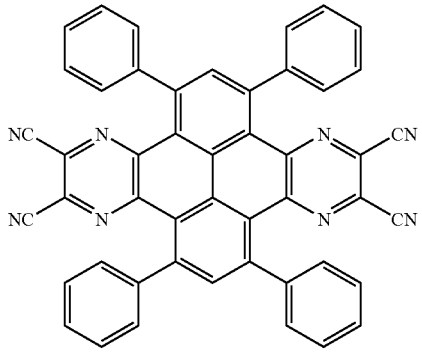
[2-27]
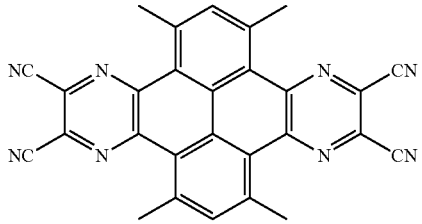
[2-28]
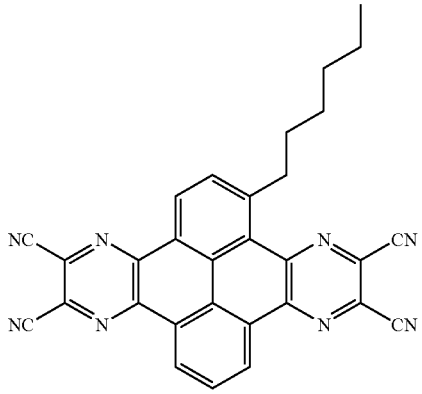
[2-29]
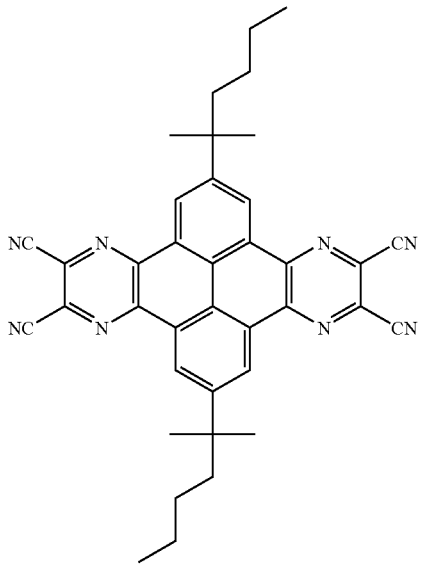

[2-30]
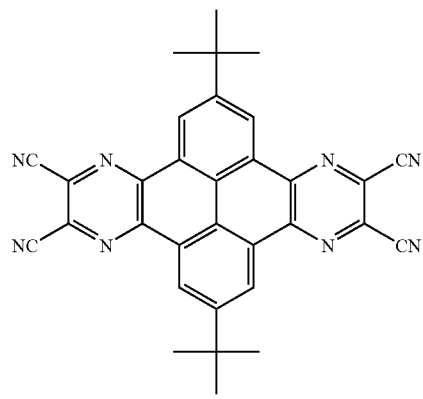
[2-31]
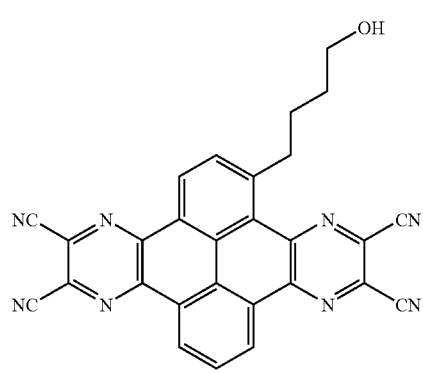
[2-32]
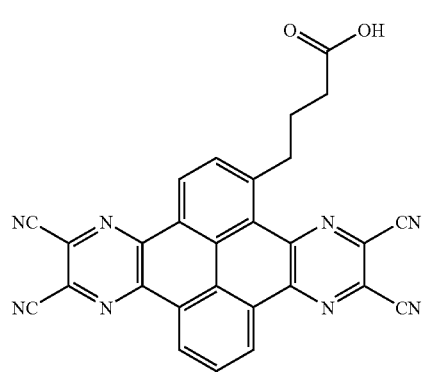
[2-33]
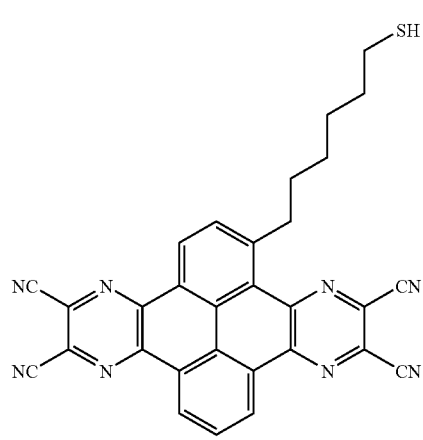
[2-34]
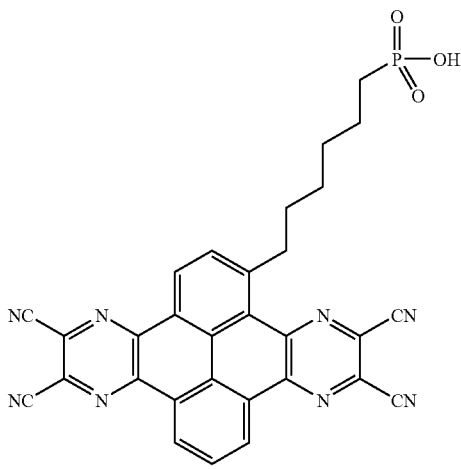
[2-35]
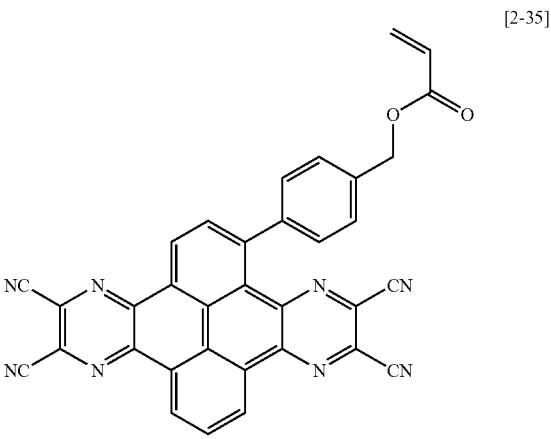
[2-36]
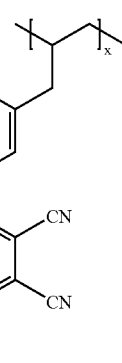

[2-37]

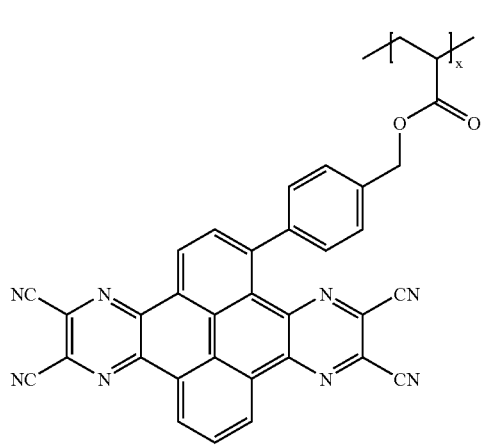

[2-38]

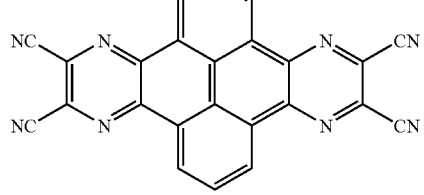

[2-39]

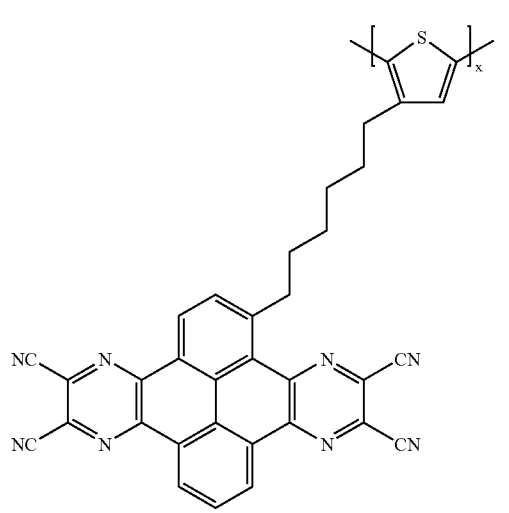

[2-40]

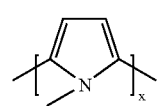

[2-41]

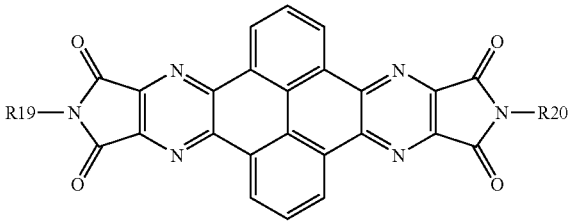

In the above formulae, x is 2 to 10,000,000, and R19 and R20 are each independently substituted or unsubstituted $C_1$-$C_{60}$ alkyl or substituted or unsubstituted $C_1$-$C_{60}$ aryl.

The organic thin film transistor is an electronic device with three terminals called a source electrode, a drain electrode, and a gate electrode. Numerous structures of the organic thin film transistors exist. Hereinbelow, the structures of the organic thin film transistor according to the present invention will be described in detail with reference to the figures. The figures and the descriptions on the figures are provided only for the illustrative purpose, and thus the scope of the present invention is not limited thereto.

FIG. 1 shows a cross-sectional view of an organic thin film transistor according to one embodiment of the present invention. The organic thin film transistor as shown in FIG. 1 was a top-contact structure of a bottom-gate, and comprises a substrate 11, a gate electrode 16 disposed on the substrate, an insulating layer 12 disposed on the gate electrode and the substrate, a semi-conducting layer 14 disposed on the insulating layer, and a source electrode 15 and a drain electrode 11 disposed on the semi-conducting layer and the insulating layer. The organic thin film transistor as shown in FIG. 1 has a structure comprising a monolayered organic layer, wherein the semi-conducting layer 14 comprises the compound of the formula 1.

The organic thin film transistor of FIG. 1 can be prepared by patterning the gate electrode 16 onto the substrate 11, forming the insulating layer 12 on the substrate and the gate electrode, forming the p- and n-type semi-conducting layer 14 on the insulating layer 12, and then forming the source electrode 15 and the drain electrode 11 on the semi-conducting layer 14 and the insulating layer 12.

FIGS. 2 to 5 show a top-contact structure of a bottom-gate, comprising a bilayered organic layer. With this structure, the semi-conducting layer 14 constitutes one layer, and the organic layer 17 which is inserted between the semi-conducting layer 14 and at least one electrode of the source electrode and the drain electrode constitutes the other layer. The organic layer 17 comprises the compound of the formula 1.

As shown in FIGS. 2 to 5, the organic thin film transistor is a structure comprising a substrate 11, a gate electrode 16 disposed on the substrate, an insulating layer 12 disposed on the gate electrode and the substrate, a semi-conducting layer 14 disposed on the insulating layer, and a source electrode 15 and a drain electrode 11 disposed on the semi-conducting layer and the insulating layer, wherein the organic layer 17 comprising the compound of the formula 1 is formed to be patterned and inserted between the semi-conducting layer 14 and the source electrode 15/drain electrode 11 (FIG. 2), between the semi-conducting layer 14 and the source electrode 15 (FIG. 3), or between the semi-conducting layer 14 and the drain electrode 11 (FIG. 4), or to be in contact with the source electrode 15 and the drain electrode 11 without patterning (FIG. 5).

In the case where the organic layer 17 comprising the compound of the formula 1 is not patterned, and connects between the source electrode 15 and the drain electrode 11, the current capacity in the off-state may be increased due to the conductivity of the organic layer 17, thus it being preferable that the organic layer 17 is patterned and inserted. However, even in the case where the organic layer 17 comprising the compound of the formula 1 used in the present invention is not patterned, increase in the current capacity in the off-state can be suppressed.

In the organic thin film transistor having such the structure, the charge-carrier can be formed on the semi-conducting layer 14 by applying voltage to the gate electrode 16. For example, the positive charge-carrier (hole) can be formed in a p-type semi-conducting layer by using negative gate voltage, while the negative charge-carrier (electron) can be formed in an n-type semi-conducting layer by using positive gate voltage. The density of charge-carriers in the semi-conducting layer can be modulated by gate voltage, so that the current-flow between the source electrode and the drain electrode can be controlled by the voltage applied to gate electrode.

FIG. 6 shows a cross-sectional view of an organic thin film transistor according to another embodiment of the present invention. The organic thin film transistor as shown in FIG. 6 has a bottom-contact structure of a bottom-gate, which comprises a substrate 11, a gate electrode 16 disposed on the substrate, an insulating layer 12 disposed on the gate electrode and the substrate, a source electrode 15 and a drain electrode 11 disposed on the insulating layer, and a semi-conducting layer 14 disposed on the insulating layer, the source electrode and the drain electrode. The organic thin film transistor of FIG. 6 has a structure comprising a monolayered organic layer, wherein the semi-conducting layer 14 comprises the compound of the formula 1.

The organic thin film transistor having the bottom-contact structure of the bottom-gate can be also prepared such that it comprises a bilayered organic layer. In this case, the semi-conducting layer 14 constitutes one layer, and the organic layer 17 inserted between the semi-conducting layer 14, and at least one electrode of the source electrode and the drain electrode constitutes the other layer. The organic layer 17 comprises the compound of the formula 1. Specifically, the organic thin film transistor has a structure comprising a substrate 11, a gate electrode 16 disposed on the substrate, an insulating layer 12 disposed on the gate electrode and the substrate, a source electrode 15 and a drain electrode 11 disposed on the insulating layer, a semi-conducting layer 14 disposed on the insulating layer, the source electrode and the drain electrode, and the organic layer 17 comprising the compound of the formula 1 is formed to be patterned and inserted between the semi-conducting layer 14 and the source electrode 15/drain electrode 11 (FIG. 8), between the semi-conducting layer 14 and the source electrode 15 (not shown), or between the semi-conducting layer 14 and the drain electrode 11 (not shown), or to be in contact with the insulating layer 12, the source electrode 15 and the drain electrode 11 without patterning (FIG. 7).

Further, the organic thin film transistor according to another embodiment of the present invention comprises a source electrode 15 and a drain electrode 11 disposed on the substrate 13, a semi-conducting layer 14 disposed on the substrate 13, the source electrode 15 and the drain electrode 11, an insulating layer 12 disposed on the semi-conducting layer 14, and a gate electrode 16 disposed on the insulating layer 12, wherein the semi-conducting layer 14 comprises the compound of the formula 1.

Further, the organic thin film transistor according to another embodiment of the present invention comprises a source electrode 15 and a drain electrode 11 disposed on the substrate 13, a semi-conducting layer 14 disposed on the substrate 13, the source electrode 15 and the drain electrode 11, an insulating layer 12 disposed on the semi-conducting layer 14, and a gate electrode 16 disposed on the insulating layer 12, wherein the organic layer 17 comprising the compound of the formula 1 is further inserted between the semi-conducting layer 14 and the source electrode 15/drain electrode 11, between the semi-conducting layer 14 and the source electrode 15, or between the semi-conducting layer 14 and the drain electrode 11. The structure in which the organic layer 17 comprising the compound of the formula 1 is inserted between the semi-conducting layer 14 and the source electrode 15/drain electrode 11 is illustrated in FIG. 10.

The organic thin film transistor according to another embodiment of the present invention may have a structure comprising a semi-conducting layer 14 disposed on the substrate 13, a source electrode 15 and a drain electrode 11 disposed on the semi-conducting layer 14, an insulating layer 12 disposed on the semi-conducting layer 14, the source electrode 15 and the drain electrode 11, and a gate electrode 16 disposed on the insulating layer 12, wherein the semi-conducting layer 14 comprises the compound of the formula 1.

The organic thin film transistor according to another embodiment of the present invention has a structure comprising a semi-conducting layer 14 disposed on the substrate 13, a source electrode 15 and a drain electrode 11 disposed on the semi-conducting layer 14, an insulating layer 12 disposed on the semi-conducting layer 14, the source electrode 15 and the drain electrode 11, and a gate electrode 16 disposed on the insulating layer 12, wherein the organic layer 17 comprising the compound of the formula 1 is inserted between the semi-conducting layer 14 and the source electrode 15/drain electrode 11, between the semi-conducting layer 14 and the source electrode 15, or between the semi-conducting layer 14 and the drain electrode 11.

The present invention further provides a process for preparing an organic thin film transistor, comprising a step of forming one or more organic layer comprising a gate electrode, an insulating layer, a source electrode, a drain electrode, and a semi-conducting layer, wherein at least one layer on the organic layers comprises the compound represented by the formula 1. It is preferable that the organic layer comprising the compound of the formula 1 is formed to be in contact with the source electrode, the drain electrode or both the source electrode and the drain electrode.

The organic layer comprising the compound of the formula 1 may be a semi-conducting layer, or an organic layer which is separately formed from the semi-conducting layer, and is formed between the semi-conducting layer, and at least one electrode of the source electrode and the drain electrode.

Specifically, the process for preparing an organic thin film transistor according to one embodiment of the present invention comprises the steps of forming a gate electrode on a substrate; forming an insulating layer on the gate electrode and the substrate; forming a semi-conducting layer comprising the compound of the formula 1 on the insulating layer; and forming a source electrode and a drain electrode on the semi-conducting layer and the insulating layer.

The process for preparing an organic thin film transistor according to another embodiment of the present invention comprises the steps of forming a gate electrode on a substrate; forming an insulating layer on the gate electrode and the substrate; forming a semi-conducting layer on the insulating layer; forming an organic layer comprising the compound of the formula 1 on the semi-conducting layer; and forming a source electrode and a drain electrode on the organic layer and the insulating layer.

The process for preparing an organic thin film transistor according to another embodiment of the present invention comprises the steps of forming a gate electrode on a substrate; forming an insulating layer on the gate electrode and the substrate; forming a source electrode and a drain electrode on the insulating layer; and forming a semi-conducting layer comprising the compound of the formula 1 on the insulating layer, the source electrode and the drain electrode.

The process for preparing an organic thin film transistor according to another embodiment of the present invention comprises the steps of forming a gate electrode on a substrate; forming an insulating layer on the gate electrode and the substrate; forming a source electrode and a drain electrode on the insulating layer; forming an organic layer comprising the compound of the formula 1 on the insulating layer, the source electrode and the drain electrode; and forming a semi-conducting layer on the organic layer.

The process for preparing an organic thin film transistor according to another embodiment of the present invention comprises the steps of forming a source electrode and a drain electrode on a substrate; forming a semi-conducting layer comprising the compound of the formula 1 on the substrate, the source electrode and the drain electrode; and forming an insulating layer on the semi-conducting layer; and forming a gate electrode on the insulating layer.

The process for preparing an organic thin film transistor according to another embodiment of the present invention comprises the steps of forming a source electrode and a drain electrode on a substrate; forming an organic layer comprising the compound of the formula 1 on the substrate, the source electrode and the drain electrode; forming a semi-conducting layer on the organic layer; forming an insulating layer on the semi-conducting layer; and forming a gate electrode on the insulating layer.

The process for preparing an organic thin film transistor according to another embodiment of the present invention comprises the steps of forming a semi-conducting layer comprising the compound of the formula 1 on a substrate; forming a source electrode and a drain electrode on the semi-conducting layer; forming an insulating layer on the semi-conducting layer, the source electrode and the drain electrode; and forming a gate electrode on the insulating layer.

The process for preparing an organic thin film transistor according to another embodiment of the present invention comprises the steps of forming a semi-conducting layer on a substrate; forming an organic layer comprising the compound of the formula 1 on the semi-conducting layer; forming a source electrode and a drain electrode on the organic layer; forming an insulating layer on the organic layer, the source electrode and the drain electrode; and forming a gate electrode on the insulating layer.

Next, each of the components used in the organic thin film transistor and the effect of the present invention will be explained in more detail.

Substrate

Glass, semiconductor wafers, metal oxide, ceramic materials, plastics, and the like which can satisfy the thermodynamic and mechanical requirements for the organic thin film transistors can be used as the substrate 13.

Gate Electrode

Conductive materials can be used for the gate electrode 16, including, but not limited to, carbon, aluminum, vanadium, chromium, copper, zinc, silver, gold, magnesium, calcium, sodium, potassium, titanium, indium, yttrium, lithium, gadolinium, tin, lead, similar metals, and alloys of the foregoing metals; p- or n-doped silicon; zinc oxide, indium oxide, indium tin oxide (ITO), indium zinc oxide and similar tin oxides or tin oxide indium-based complex compounds; mixtures of oxides and metals, such as ZnO:Al, $SnO_2$:Sb; and conductive polymers, such as poly(3-methylthiophene), poly[3,4-(ethylene-1,2-dioxy)thiophene], polypyrrole and polyaniline.

Insulating Layer

Insulator materials which can be used in the insulating layer 12, include, but not limited to, silicon oxide, silicon nitride; and a plastic insulator such as polyimide, poly(2-vinylpyridine), and poly(4-vinylphenol), polymethyl methacrylate.

Semi-conducting Layer

There are two types of molecules, which can be used in semi-conducting layer; p- and n-type organic semi-conducting materials. Holes are the charge-carrier in the case of p-type semi-conducting materials while electrons are the charge-carrier in the case of n-type semi-conducting materials.

Examples of the p-type organic semi-conducting materials include, but are not limited to, pentacene, antradithiophene, benzodithiophene, thiophene oligomers, polythiophenes, mixed-subunit thiophene oligomers, oxy-functionalized thiophene oligomers (H. E. Katz et al., Acc. Chem. Res. 34, 359 (2001)), and the like.

Examples of the n-type organic semi-conducting materials include fluorinated metallophtahlocyanines (Z. Bao, J. Am. Chem. Soc. 120, 207 (1998)), perfluoroarene-modified polythiophene (A. Facchetti, Angew. Chem. Int. Ed. 42, 3900 (2003)), and the like.

Further, the compound of the formula 1 of the present invention may be contained in the semi-conducting layer.

Organic Layer in Contact With Source Electrode or Drain Electrode

The organic layer comprises at least one compound represented by the formula 1. The organic layer comprising at least one compound represented by the formula 1 promotes the establishment of the ohmic contact between the semi-conducting layer and the source electrode, the drain electrode or both the source electrode and the drain electrode. Therefore, the threshold voltage and the charge-carrier mobility in the organic thin film transistor can be improved with the organic layer comprising at least one compound represented by the formula 1.

The organic layer comprising at least one compound represented by the formula 1 can be formed using a solution process such as vacuum deposition, screen-printing, ink-jet printing, micro-contact printing, spin coating, dip coating, SAM (Self-Assembled Monolayer) and the like. In the case of the SAM process, using a compound which can be subject to the SAM process, the compound represented by the formula 1 can be selectively applied to the source electrode and the drain electrode. Further, the organic layer comprising at least one compound represented by the formula 1 can exhibit better effects at a thickness of several tens nm form the monomolecular layer, preferably at a thickness as small as 100 nm from the monomolecular layer.

Source Electrodes/Drain Electrodes

Conductive materials can be used for the source electrode/drain electrode, including, but not limited to, carbon, aluminum, vanadium, chromium, copper, zinc, silver, gold, magnesium, calcium, sodium, potassium, titanium, indium, yttrium, lithium, gadolinium, tin, lead, neodymium, platinum, palladium, similar metals, and alloys of the foregoing metals; p- or n-doped silicon; zinc oxide, indium oxide, indium tin oxide (ITO), indium zinc oxide and similar tin oxides or tin oxide indium-based complex compounds; mixtures of oxides and metals, such as ZnO:Al, $SnO_2$:Sb; and conductive polymers, such as poly(3-methylthiophene), poly[3,4-(ethylene-1,2-dioxy)thiophene], polypyrrole and polyaniline.

In addition, materials for the source/drain electrodes have a suitable work function to reduce the charge-carrier injection barrier and form an ohmic contact with the organic layer. When p-type materials are used in semi-conducting layer 14, the work functions of source/drain electrode materials match or are close to a highest occupied molecular orbital (HOMO) level of the p-type organic materials. Therefore, metals with a large work function are preferred for the source electrode/drain electrode, including palladium, platinum and gold. When n-type materials are used in semi-conducting layer 14, the work functions of source/drain electrode materials match or are close to a lowest unoccupied molecular orbital (LUMO) level of the n-type organic materials. Therefore, metals with a low work function are preferred for the source electrode/drain electrode, including aluminum.

However, the performance of an organic thin film transistor according to the present invention showed weak dependence on the source/drain electrode materials with the organic layer comprising the compound of the formula 1. It allows us to fabricate organic thin film transistors in various ways, including screen-printing, reel-to-reel process (J. A. Rogers et al., Adv. Mater. 11, 741 (1999)), micro-contact printing and the like. Therefore, in the present invention, there are a variety of electrode materials that can be used for the source/drain electrode without deteriorating the performance of the organic thin film transistor with the organic layer comprising the compound of the formula 1.

For example, by using the organic layer represented by the above formula 1, aluminum can be used as the source/drain electrodes in the configuration of FIG. 10. As shown in FIG. 10, aluminum can be patterned so as to easily make the array of the source electrode 15/the drain electrode 11 by using photolithography techniques and etching methods. Further, silver paste, which is one of screen printable conductive inks, can be patterned by a screen-printing method, can be used as the source electrode 15/the drain electrode 11.

In the present invention, for the source electrode and the drain electrode, materials such as aluminum, silver, gold, neodymium, palladium, platinum, and alloys of the foregoing metals can be particularly preferably used.

The present invention further provides an electronic device comprising the organic thin film transistor according to the present invention. The electronic device according to the present invention is not limited in the kinds as long as it comprises the organic thin film transistor of the present invention as a component, and it can be exemplified by an E-paper, a smart card, and a display device.

Advantageous Effects

The organic thin film transistor according to the present invention facilitates the electric contact between the semi-conducting layer and the source electrode/drain electrode with on organic layer comprising an organic compound facilitating the ohmic contact between a semi-conducting layer and source electrode/drain electrode and serving as the semi-conducting layer. As a result, as the materials for the source electrode or the drain electrode in the organic thin film transistor, materials which are less expensive and excellent in processibility though they have a low work function can be used.

Accordingly, the organic thin film transistor according to the present invention has excellent electric contact between the semi-conducting layer and the source electrode/drain electrode, and thus can be widely used as components for an electric/electronic device. In particular, the organic thin film transistor according to the present invention can be applied to E-papers, smart cards, and possibly display devices.

In the following detailed description, only the preferred embodiments of the present invention have been shown and described, simply by way of illustration of the best mode. As will be realized, the present invention is capable of modification in various obvious respects, all without departing from the present invention.

BEST MODE

The following Examples are presented for the purpose of giving better understanding of the present invention. However, the following Examples are presented simply for the purpose of illustration, and thus the present invention is not intended to be limited thereto.

EXAMPLE 1

Figure 5:
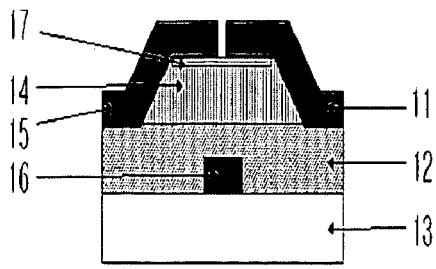
Figure 6:
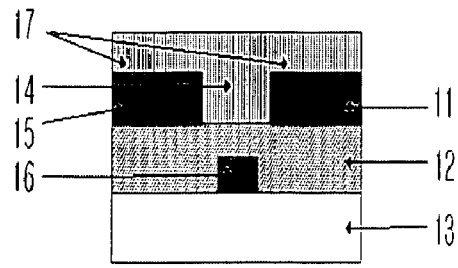
Figure 9:
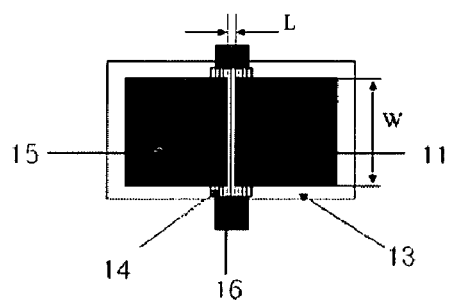
FIG. 9 is a top view of an organic thin film transistor having the cross-section in FIG. 2, wherein W and L correspond to the channel width and the length of the organic thin film transistor, respectively.
Figure 10:
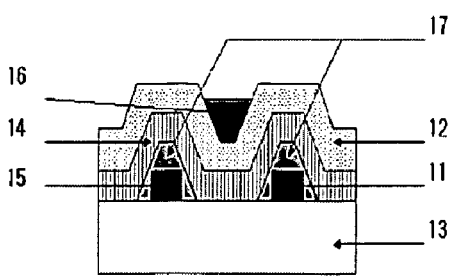
FIG. 10 is a simplified cross-sectional view of an organic thin film transistor according to one embodiment of the present invention.

A field-effect transistor was fabricated in a top-contact structure of a bottom-gate as shown in FIG. 5. An n-doped silicone wafer was used as the substrate 13 and the gate electrode 16. The gate dielectric or insulating layer 12 was prepared by thermally growing silicon dioxide ($SiO_2$) on the n-doped silicone. The thickness of the silicon dioxide ($SiO_2$) gate insulating layer was 300 nm. The semi-conducting layer 14 was formed on top of silicon dioxide ($SiO_2$) gate insulating layer 12. Pentacene was used as a p-type semi-conducting material. Pentacene layer 14 was deposited with a rate of 0.3 Å/s under the base pressure of $1 \times 10^{-6}$ Torr. The thickness of the pentacene layer is 50 nm. The organic layer 17 and the gold (Au) source/drain electrodes 15 and 11, respectively, were deposited on top of the pentacene film through a shadow mask as shown in FIG. 5. The organic layer 17 was deposited on top of the pentacene film prior to the deposition of the Au source electrode 15/drain electrode 11 without patterning as shown in FIG. 5. The compound represented by Formula 2-11 was used for the formation of the organic layer 17. The organic layer 17 was deposited with a rate of 0.5 Å/s under the base pressure of $1 \times 10^{-6}$ Torr, and the thickness of the organic layer 17 was 20 nm. As shown in FIG. 9, the channel length (L) and the width (W) of the organic FET have profound effects on the performance of the organic thin film transistor. The channel length and the width of the organic thin film transistor were 1 mm and 100 μm, respectively, in accordance with Examples of the present invention.

Figure 11:
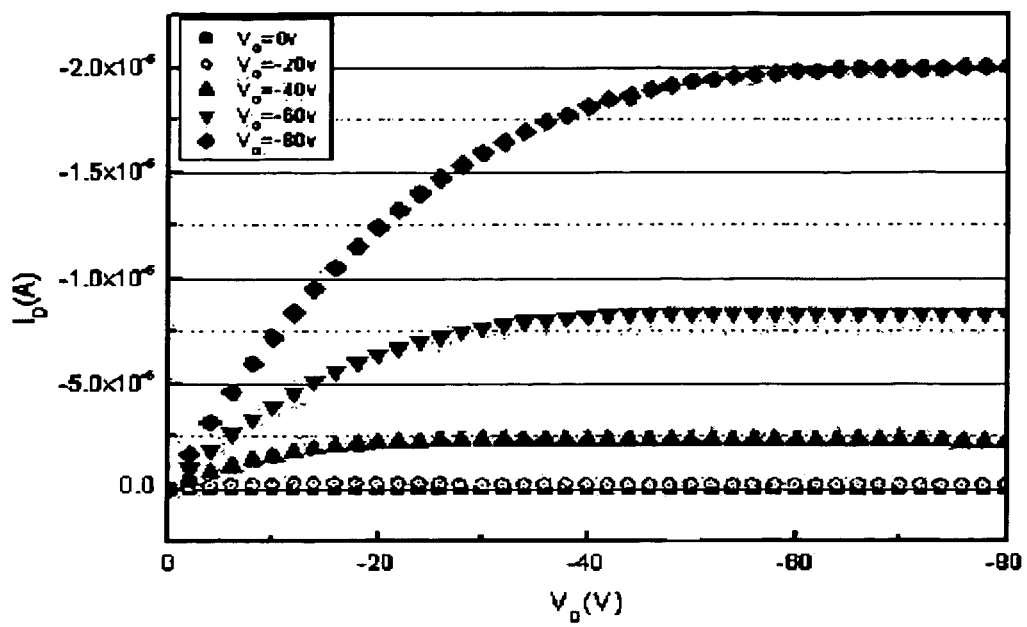
FIGS. 11 to 26 are graphs of the drain-source current ($I_{DS}$) versus the drain-source voltage ($V_{DS}$) characteristics for several gate voltages ($V_G$), and graphs of the $(I_{DS})^{1/2}$ versus $V_G$ characteristics.
Figure 12:
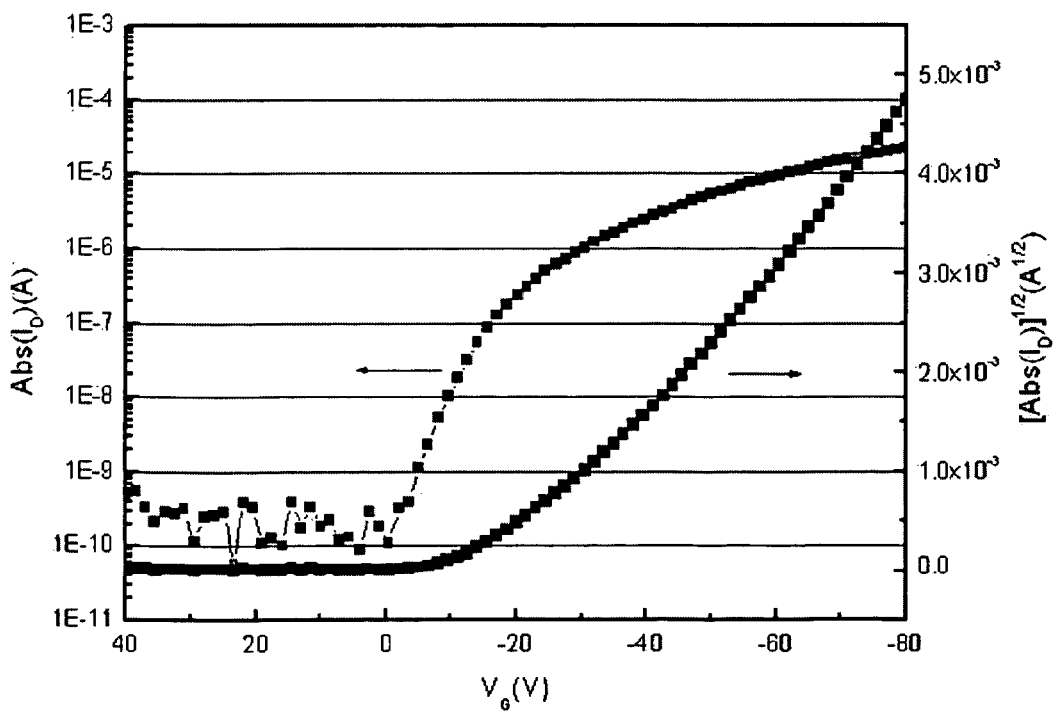

A graph illustrating the drain-source current ($I_{DS}$) versus drain-source voltage ($V_{DS}$) characteristics for several gate voltages ($V_G$) is shown in FIG. 11. The $(I_{DS})^{1/2}$ versus $V_G$ characteristics for pentacene transistors ($V_{DS}=-40V$) is shown in FIG. 12. In the saturation regime of the drain-source current, the field-effect mobility is calculated as $\mu_{FET}=0.03$ $cm^2/Vs$.

EXAMPLE 2

A device was fabricated in the same manner as described in Example 1 except for replacing gold (Au) with aluminum (Al) as the source electrode/drain electrode.

In the saturation regime of the drain-source current, the field-effect mobility is calculated as $\mu_{FET}=0.01$ $cm^2/Vs$.

It can be found that the organic thin film transistor comprising the organic layer (17) having aluminum as the materials for the source electrode/drain electrodes exhibit the similar performance to that having gold as the materials for the source electrode/drain electrodes.

EXAMPLE 3

Figure 1:
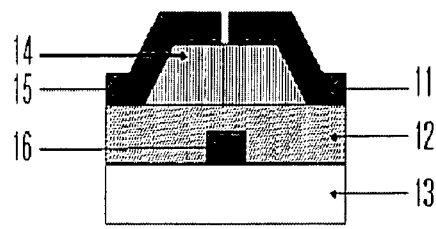
FIGS. 1 to 8 are cross-sectional views of the organic thin film transistors including organic layers according to the embodiments of the present invention, respectively.
Figure 2:
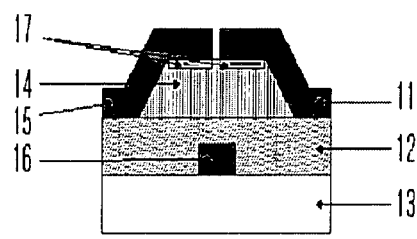
Figure 3:
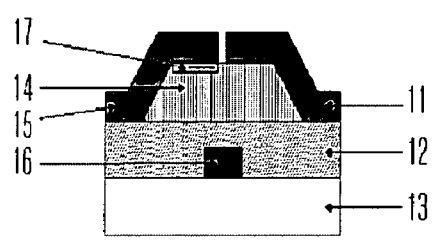
Figure 4:
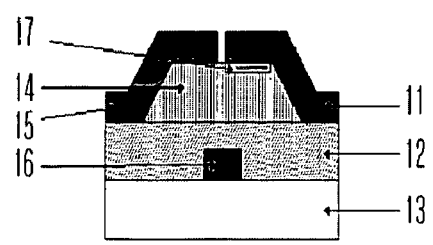

A device was fabricated in the same manner as described in Example 2 except for depositing the organic layer 17 on top of the pentacene film through a shadow mask in the same form as for the electrode as shown in FIG. 2.

Figure 13:
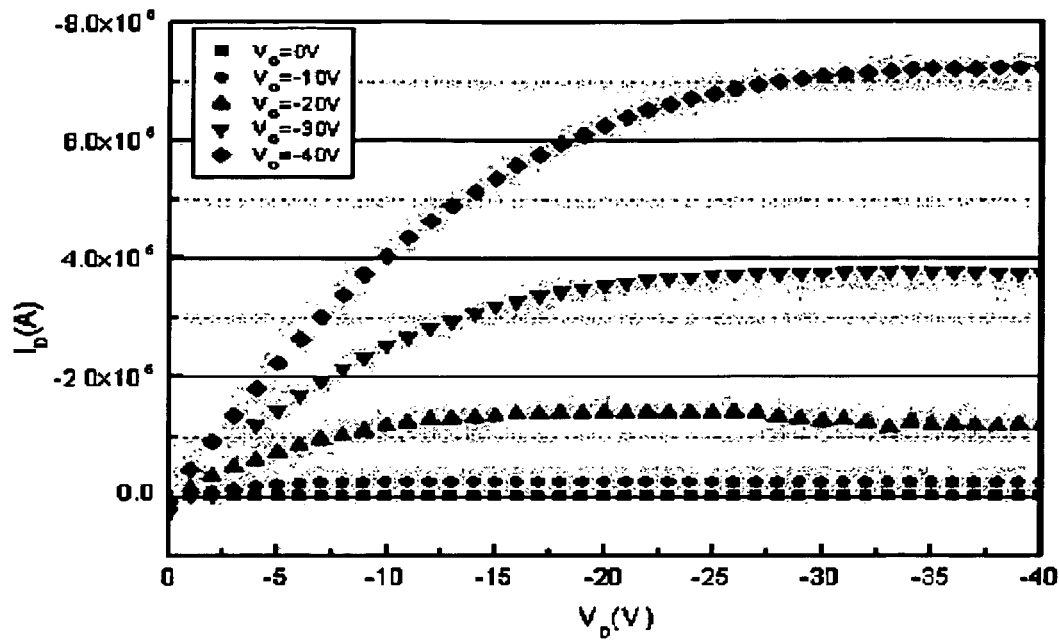
Figure 14:
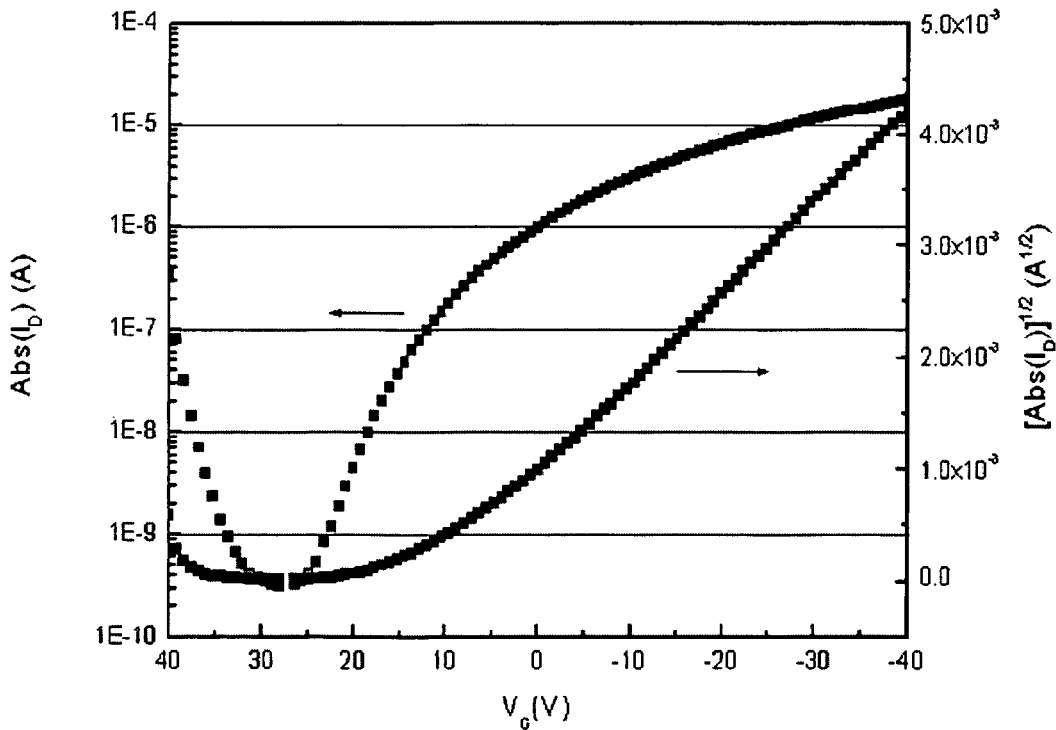

A graph illustrating the drain-source current ($I_{DS}$) versus drain-source voltage ($V_{DS}$) characteristics for several gate voltages ($V_G$) is shown in FIG. 13. The $(I_{DS})^{1/2}$ versus $V_G$ characteristics for pentacene transistors ($V_{DS}=-40V$) is shown in FIG. 14. In the saturation regime of the drain-source current, the field-effect mobility is calculated as $\mu_{FET}=0.01$ $cm^2/Vs$. The transistor having the organic layer 17 not patterned as shown in Example 2, and the transistor having the organic layer 17 patterned as shown in Example 3 exhibited the similar levels of excellent field-effect mobility. The transistor having the organic layer 17 not patterned (Example 2) has the same level of current capacity in the off-state to that of the transistor having the organic layer 17 patterned (Example 3), indicating that even when the organic layer 17 is not patterned, the current leakage by the organic layer 17 is not large.

EXAMPLE 4

A device was fabricated in the same manner as described in Example 2 except for using the compound of the formula 2-30 upon the formation of the organic layer 17.

Figure 15:
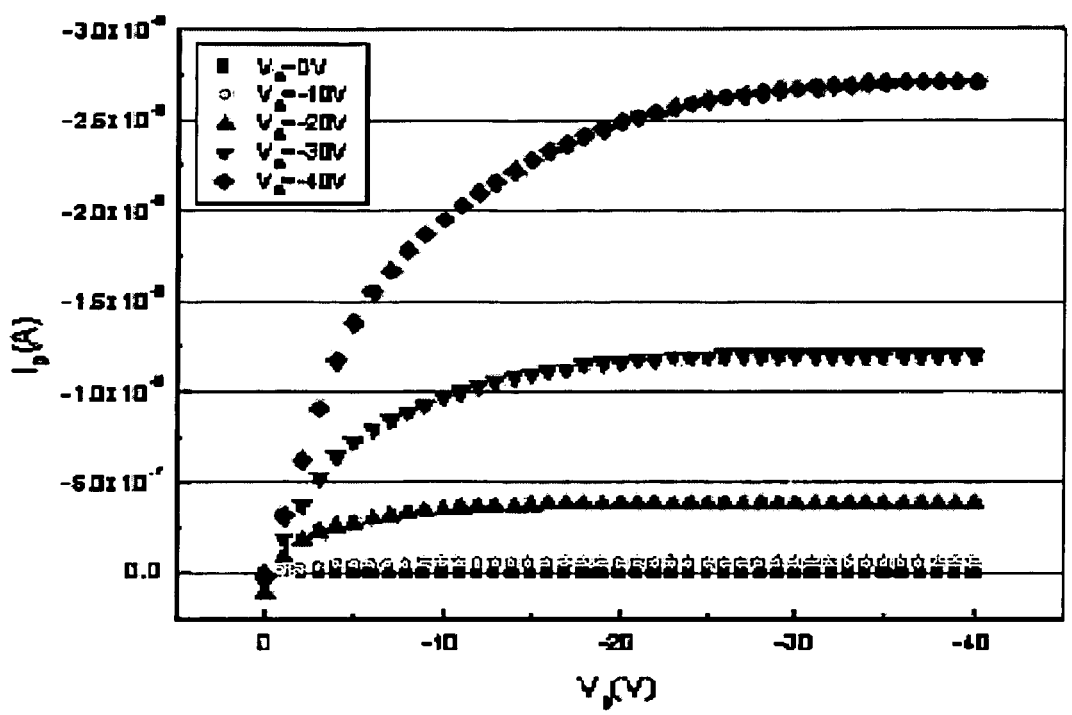
Figure 16:
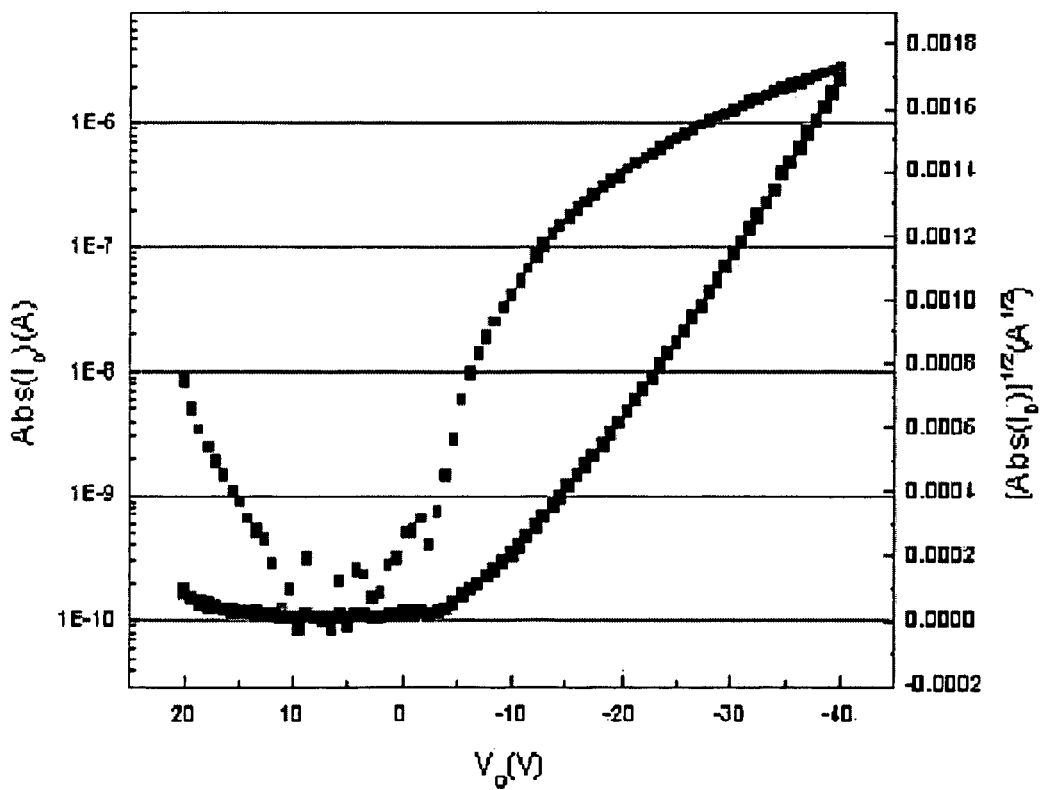

A graph illustrating the drain-source current ($I_{DS}$) versus drain-source voltage ($V_{DS}$) characteristics for several gate voltages ($V_G$) is shown in FIG. 15. The $(I_{DS})^{1/2}$ versus $V_G$ characteristics for pentacene transistors ($V_{DS}=-40V$) is shown in FIG. 16. In the saturation regime of the drain-source current, the field-effect mobility is calculated as $\mu_{FET}=0.02$ $cm^2/Vs$.

Comparative Example 1

A device was fabricated in the same manner as described in Example 1 except for forming no organic layer 17.

Figure 17:
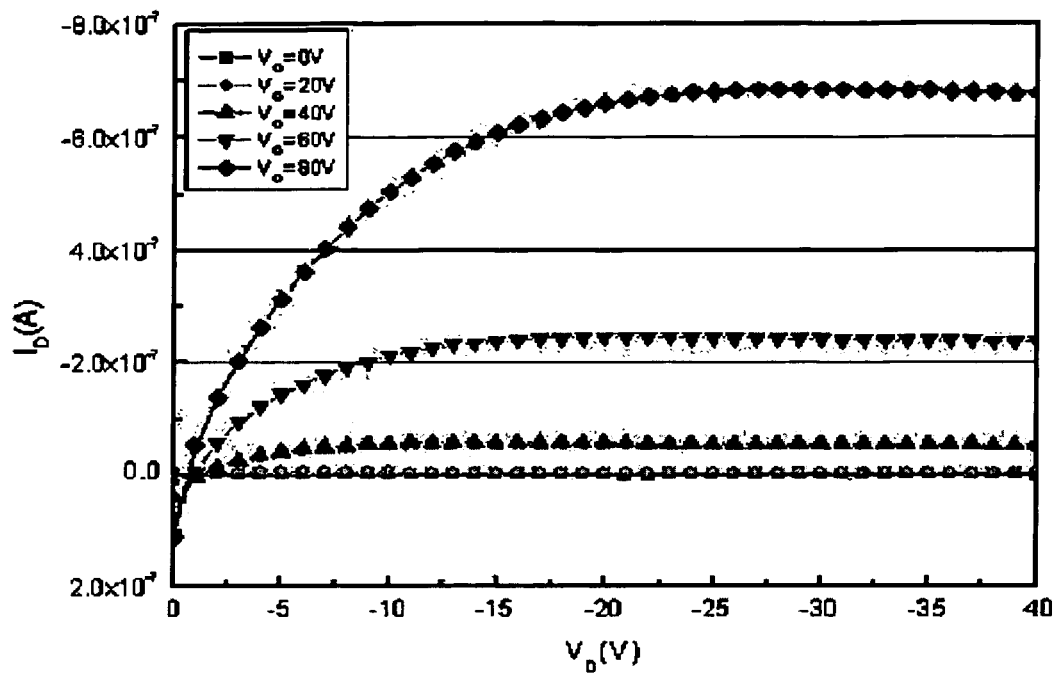
Figure 18:
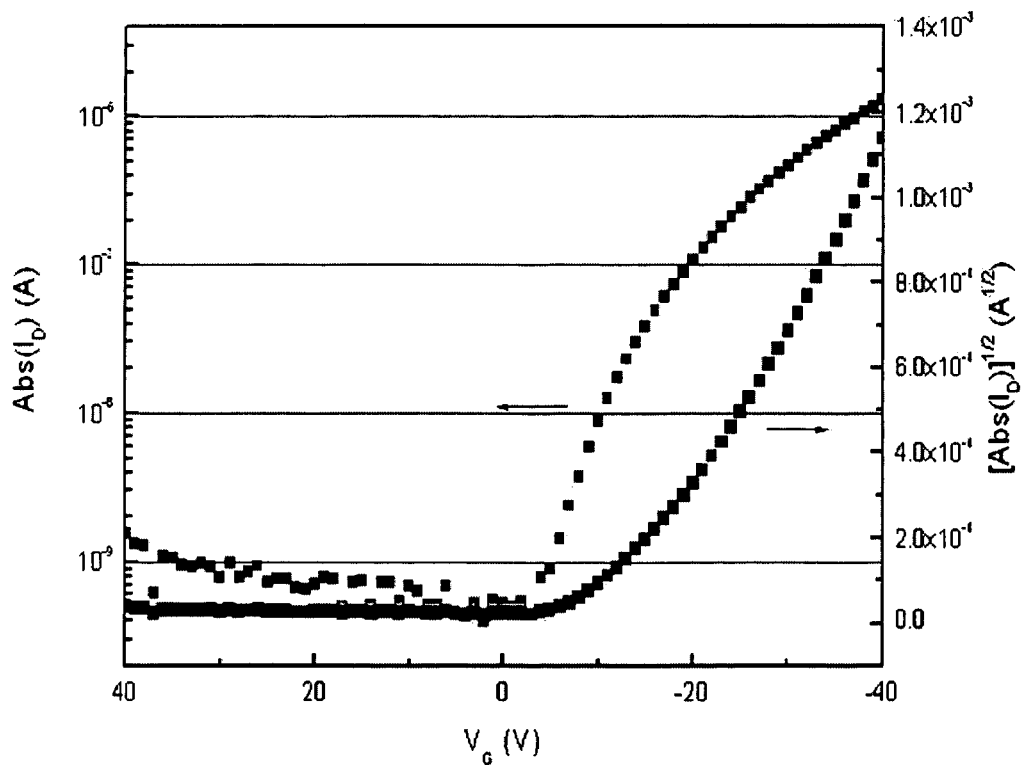

A graph illustrating the drain-source current ($I_{DS}$) versus drain-source voltage ($V_{DS}$) characteristics for several gate voltages ($V_G$) is shown in FIG. 17. A graph illustrating the $(I_{DS})^{1/2}$ versus $V_G$ characteristics for pentacene transistors ($V_{DS}=-40V$) is shown in FIG. 18. In the saturation regime of the drain-source current, the field-effect mobility is calculated as $\mu_{FET}=0.01$ $cm^2/Vs$.

Under the same gate biases, the source-drain current has a higher value for the transistor with the organic layer 17 between pentacene and Au electrode (Example 1, FIG. 11) than that for the transistor without the organic layer 17 (FIG. 17). It can be found that the transistor having the organic layer 17 disposed therewith facilitated the ohmic contact between the semi-conducting layer and the electrodes, thus improving the performance.

Comparative Example 2

A device was fabricated in the same manner as described in Comparative Example 1 except for replacing gold (Au) with aluminum (Al) as the source electrode/drain electrode in Comparative Example 1.

The device did not exhibit the transistor characteristics. It can be found that when using aluminum as the source electrode/the drain electrode, the device serves as a transistor only by facilitating the ohmic contact through the disposition of the organic layer 17 to be in contact with the source electrode or the drain electrode.

EXAMPLE 5

Figure 7:
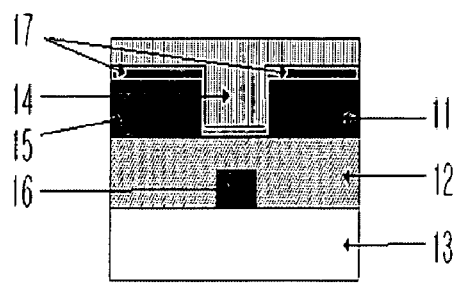
Figure 8:
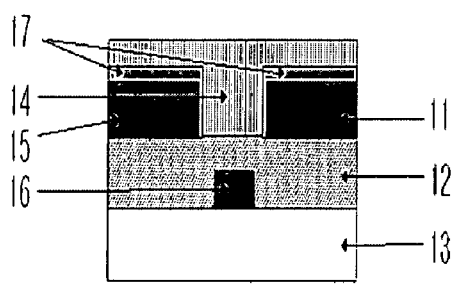

A field-effect transistor was fabricated in a bottom-contact structure of a bottom-gate as shown in FIG. 7. An n-doped silicone wafer was used as the substrate 13 and the gate electrode 16. The gate dielectric or insulating layer 12 was prepared by thermally growing silicon dioxide ($SiO_2$) on the n-doped silicone. The thickness of the silicon dioxide ($SiO_2$) gate insulating layer was 300 nm. The gold source electrode 15/drain electrode 11, respectively, were deposited on the silicon dioxide ($SiO_2$) gate insulating layer 12 through a shadow mask as shown in FIG. 7. The organic layer 17 was deposited on the substrate having the source electrode 15/drain electrode 11 not patterned thereon. The compounds represented by the formula 2-11 was used for the formation of the organic layer 17. The organic layer 17 was deposited with a rate of 0.5 Å/s under the base pressure of $1 \times 10^{-6}$ Torr. The thickness of the organic layer 17 was 20 nm. The semi-conducting layer 14 was formed on the organic layer 17 using pentacene as a p-type semi-conducting material. The pentacene layer 14 was deposited with a rate of 0.3 Å/s under the base pressure of 1×10⁻⁶ Torr. The thickness of pentacene layer was 50 nm.

Figure 19:
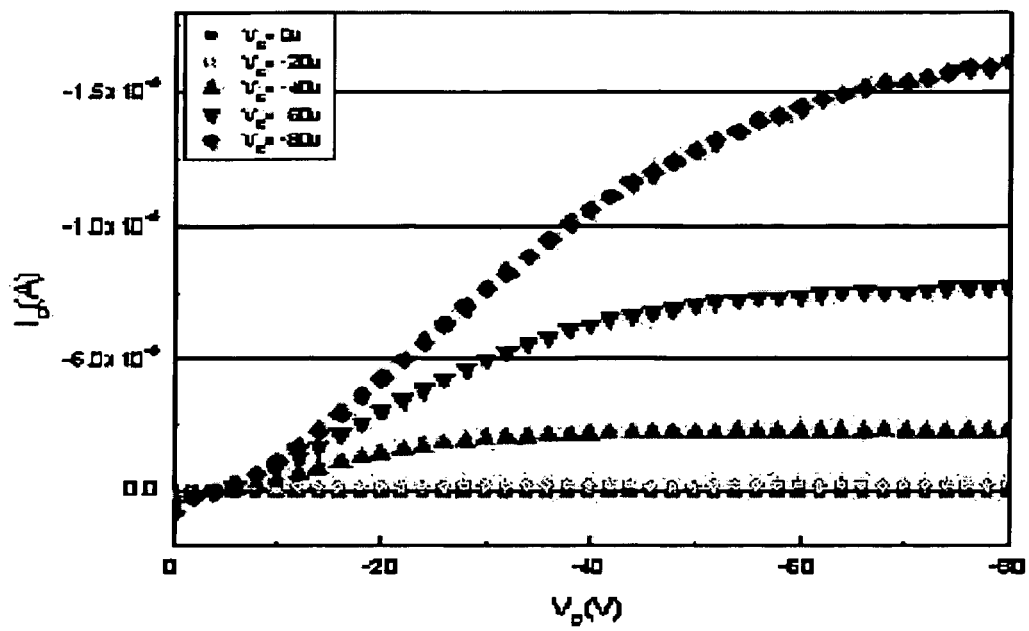
Figure 20:
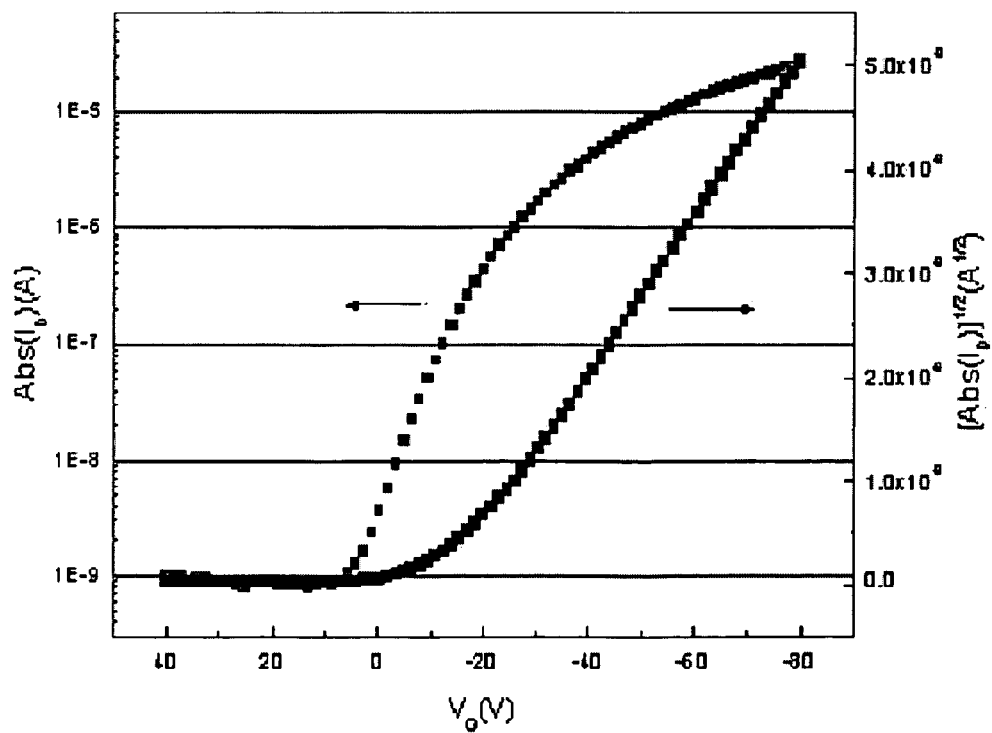

A graph illustrating the drain-source current ($I_{DS}$) versus drain-source voltage ($V_{DS}$) characteristics for several gate voltages ($V_G$) is shown in FIG. 19. The $(I_{DS})^{1/2}$ versus $V_G$ characteristics for pentacene transistors ($V_{DS}$=−40V) is shown in FIG. 20. In the saturation regime of the drain-source current, the field-effect mobility is calculated as $\mu_{FET}$=0.03 cm²/Vs. It can be found that the organic layer 17 in the bottom-contact structure also exhibits the same effect as for that in the top-contact structure.

EXAMPLE 6

A device was fabricated in the same manner as described in Example 4 except for dissolving the compound of the formula 2-38 (number average molecular weight (Mn)=8000)) in a solvent and spin-coating it to form the organic layer 17, wherein tetrahydrofuran (THF) was used as the solvent, and spinning at 1500 rpm for 20 seconds, and then drying at 80° C. for 2 minutes were performed.

Figure 21:
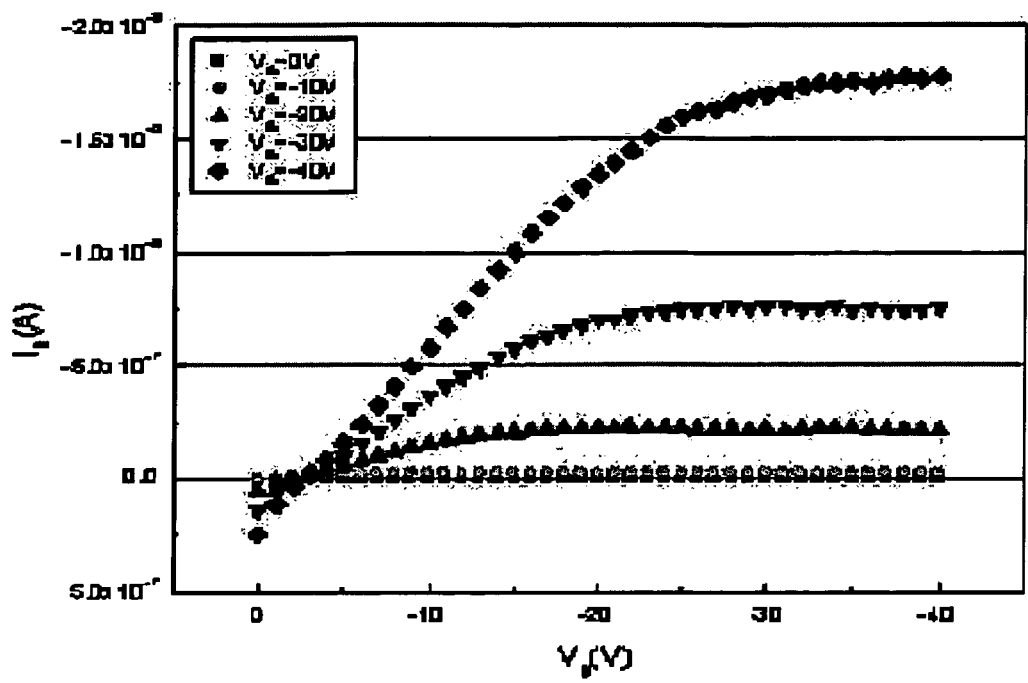
Figure 22:
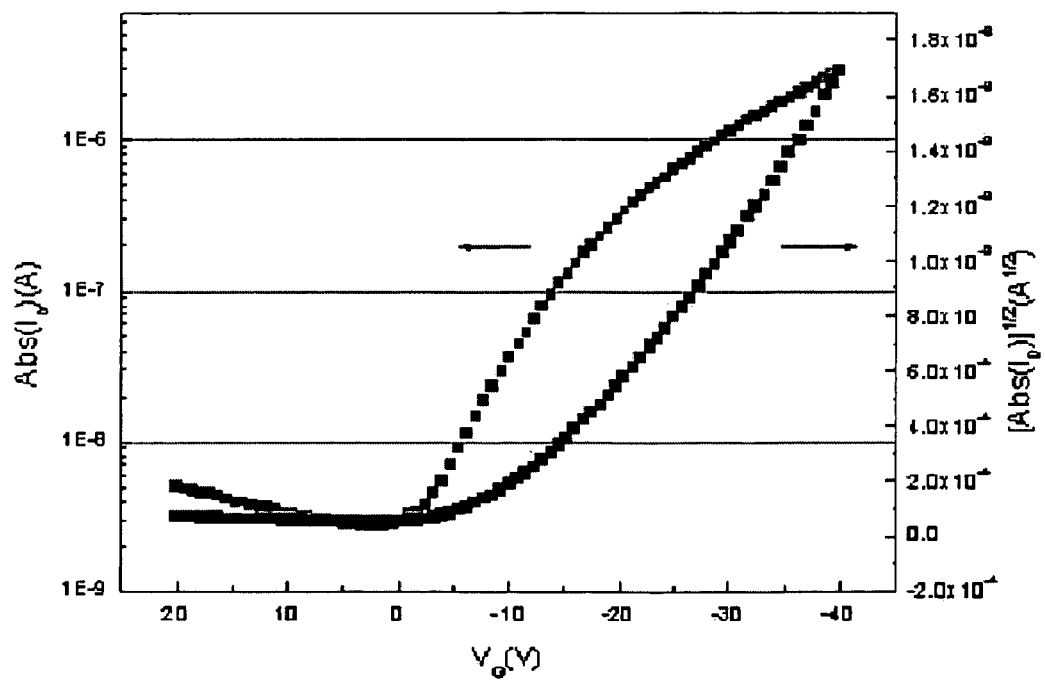

A graph illustrating the drain-source current ($I_{DS}$) versus drain-source voltage ($V_{DS}$) characteristics for several gate voltages ($V_G$) is shown in FIG. 21. The $(I_{DS})^{1/2}$ versus $V_G$ characteristics for pentacene transistors ($V_{DS}$=−40V) is shown in FIG. 22. In the saturation regime of the drain-source current, the field-effect mobility is calculated as $\mu_{FET}$=0.02 cm²/Vs.

Comparative Example 3

A device was fabricated in the same manner as described in Example 5 except for forming no organic layer 17.

Figure 23:
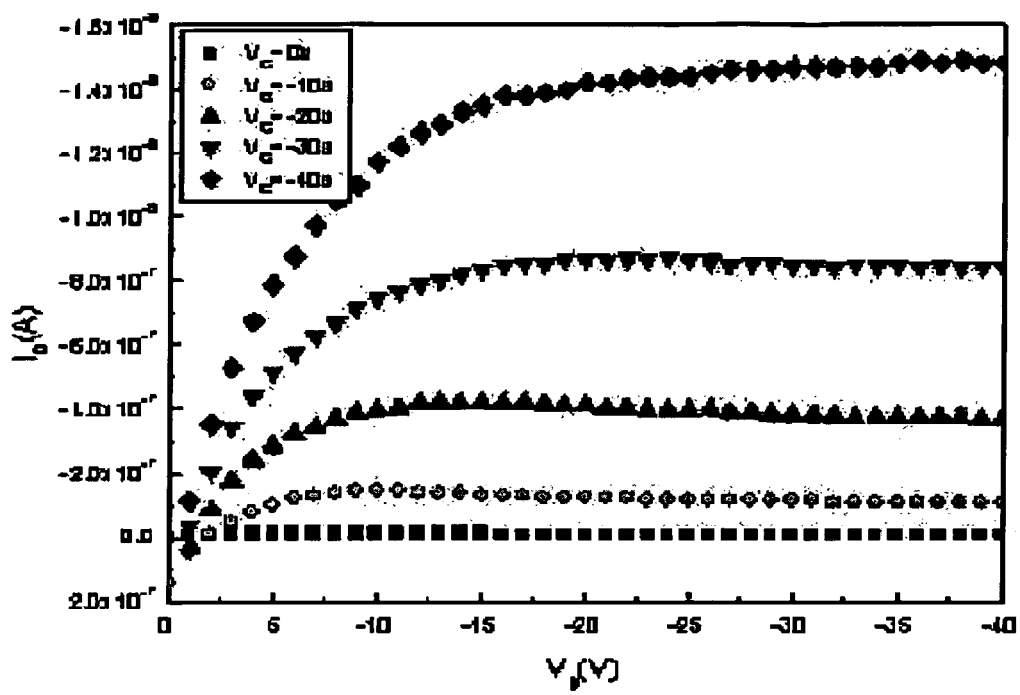
Figure 24:
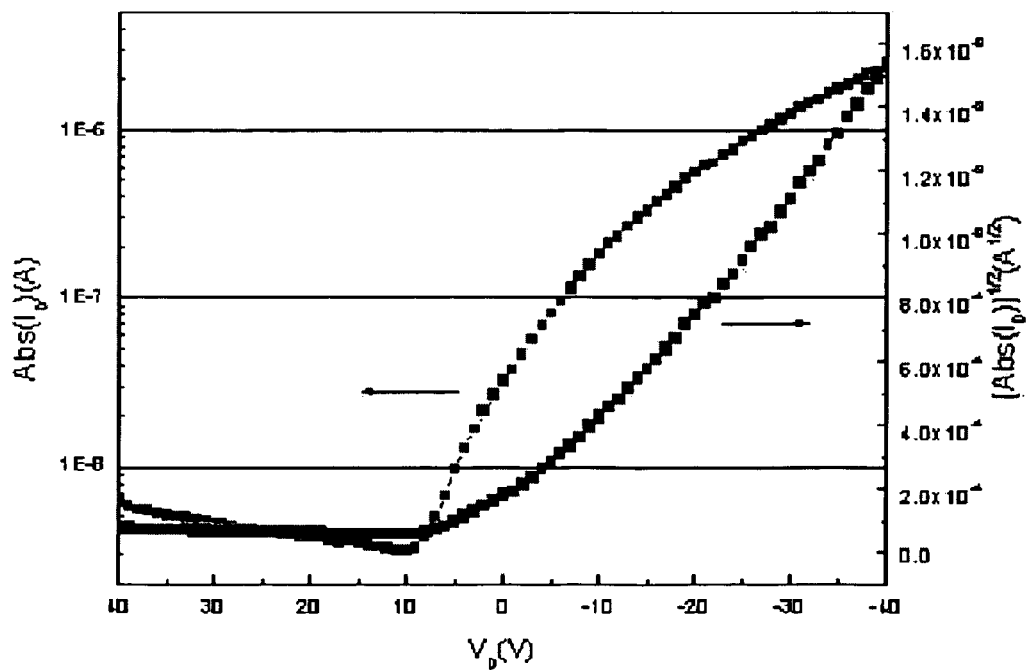

A graph illustrating the drain-source current ($I_{DS}$) versus drain-source voltage ($V_{DS}$) characteristics for several gate voltages ($V_G$) is shown in FIG. 23. A graph illustrating the $(I_{DS})^{1/2}$ versus $V_G$ characteristics for pentacene transistors ($V_{DS}$=−40V) is shown in FIG. 24. In the saturation regime of the drain-source current, the field-effect mobility is calculated as $\mu_{FET}$=0.005 cm²/Vs.

It can be found that the transistor which is even in the bottom-contact structure facilitated the ohmic contact between the semi-conducting layer and the electrodes, thus improving the performance.

EXAMPLE 7

A device was fabricated in the same manner as described in Example 5 except for forming no organic layer 17 and using the compound of the formula 2-30 instead of pentacene for the semi-conducting layer 14.

Figure 25:
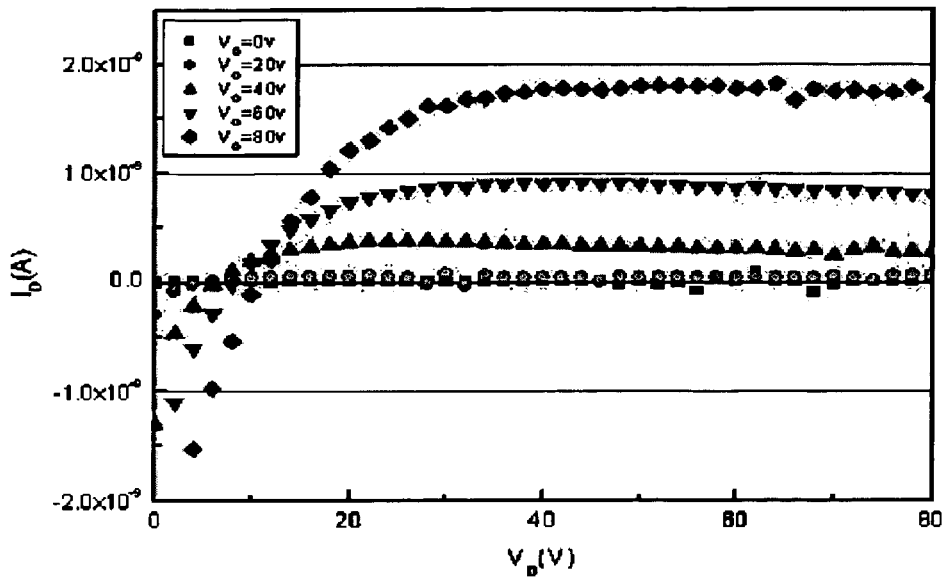
Figure 26:
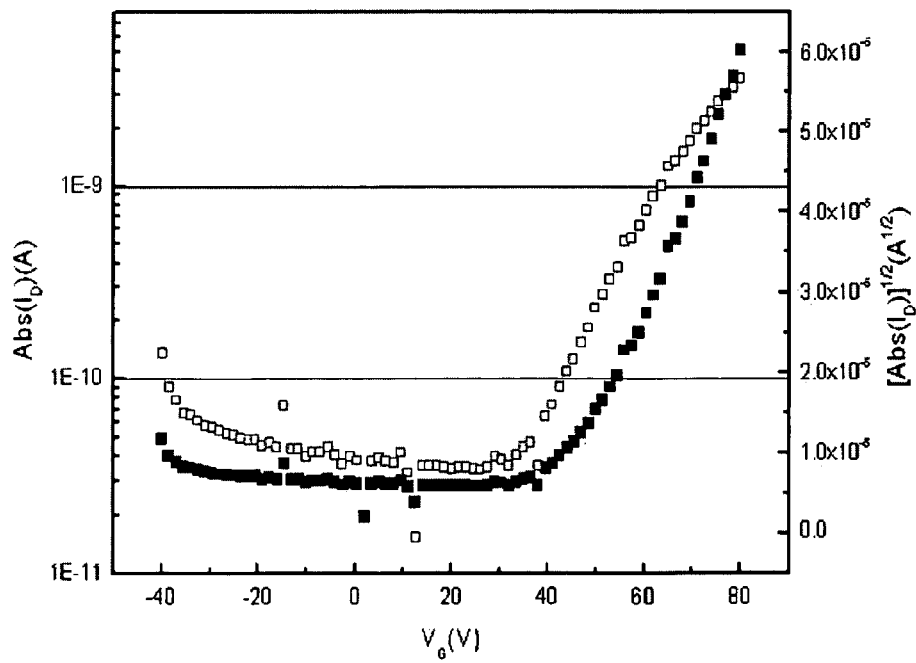

A graph illustrating the drain-source current ($I_{DS}$) versus drain-source voltage ($V_{DS}$) characteristics for several gate voltages ($V_G$) is shown in FIG. 25. A graph illustrating the $(I_{DS})^{1/2}$ versus VG characteristics for pentacene transistors ($V_{DS}$=−40V) is shown in FIG. 26. The transistor in which the compound of the formula 2-30 were used as the semi-conducting layer 14 exhibited n-type transistor characteristics, and in the saturation regime of the drain-source current, the field-effect mobility is calculated as $\mu_{FET}$=1.5×10⁻⁵ cm²/Vs.

It can be found that the compound of the formula 2 can be used as an n-type semiconductor material in the organic thin film transistor.

The invention claimed is:

1. An organic thin film transistor comprising a gate electrode, an insulating layer, a source electrode, a drain electrode, and at least one organic layer including a semi-conducting layer, wherein at least one of the organic layers comprises a compound represented by the following formula 1:

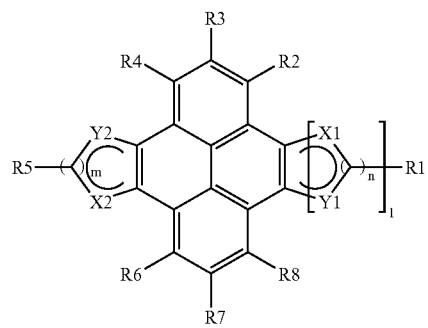

[1]

wherein m and n are each 1 or 2, l is 0 or 1,

X1 and X2 are each independently CH or N,

Y1 and Y2 are each independently NR0 in the case of n=1, and N in the case of n=2, wherein R0 is selected from the group consisting hydrogen, a substituted or unsubstituted alkyl group, and a substituted or unsubstituted aryl group, R1 to R8 are the same or different from each other, and are each independently selected from the group consisting of hydrogen, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, a nitrile group (—CN), a nitro group (—NO₂), a halogen group, an amide group (—NHCOR, —CONHR, —CONRR'), an ester group (—COOR), a sulfonyl group (—SO₂R), a sulfoxide group (—SOR), a sulfonamide group (—SO₂NRR'), a sulfonate group (—SO₃R), a trifluoromethyl group (—CF₃), an amine group (—NHR, —NRR'), and -L-M, and R1 to R8 may be bonded with an adjacent group to form an aromatic, aliphatic or heterocyclic fused ring, L is a $C_1$-$C_{60}$ alkylene group which is unsubstituted or substituted with at least one group selected from the group consisting of an amine group (—NHR, —NRR'), an amide group (—NHCOR, —CONHR, —CONRR'), an ether group (—COR) and an ester group (—COOR); a $C_6$-$C_{60}$ arylene group which is unsubstituted or substituted with at least one group selected from the group consisting of an amine group (—NHR, —NRR'), an amide group (—NHCOR, —CONHR, —CONRR'), an ether group (—COR) and an ester group (—COOR); or a 5- to 7-membered heterocyclic group which is unsubstituted or substituted with at least one group selected from the group consisting of an amine group (—NHR, —NRR'), an amide group (—NHCOR, —CONHR, —CONRR'), an ether group (—COR) and an ester group (—COOR), M is selected from the group consisting of an alcohol group (—OH), a thio group (—SH), a phosphate group (—PO₃H), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline, and R and R' are the same or different from each other, and are each independently hydrogen, a substituted or unsubstituted $C_1$-$C_{60}$ alkyl group, a substituted or unsubstituted $C_6$-$C_{60}$ aryl group, or a substituted or unsubstituted 5- to 7-membered heterocyclic group.

2. The organic thin film transistor according to claim 1, wherein the organic layer comprising the compound of the formula 1 is a semi-conducting layer.

3. The organic thin film transistor according to claim 1, wherein the organic layer comprising the compound of the formula 1 is an organic layer which is separately formed from the semi-conducting layer, and is formed between the semi-conducting layer and at least one electrode of the source electrode and the drain electrode.

4. The organic thin film transistor according to claim 3, wherein the organic layer comprising the compound of the formula 1 has a thickness ranging from a thickness of a monomolecular layer to 100 nm.

5. The organic thin film transistor according to claim 1, comprising a substrate, a gate electrode disposed on the substrate, an insulating layer disposed on the gate electrode and the substrate, a semi-conducting layer disposed on the insulating layer, a source electrode and a drain electrode disposed on the semi-conducting layer and the insulating layer, wherein the semi-conducting layer is disposed to be in contact with the source electrode and the drain electrode and comprises the compound of the formula 1.

6. The organic thin film transistor according to claim 1, comprising a substrate, a gate electrode disposed on the substrate, an insulating layer disposed on the gate electrode and the substrate, a semi-conducting layer disposed on the insulating layer, an organic layer disposed on the semi-conducting layer, and a source electrode and a drain electrode disposed on the organic layer and the insulating layer, wherein the organic layer is disposed to be in contact with the source electrode, the drain electrode or both the source electrode and the drain electrode and comprises the compound of the formula 1.

7. The organic thin film transistor according to claim 1, comprising a substrate, a gate electrode disposed on the substrate, an insulating layer disposed on the gate electrode and the substrate, a source electrode and a drain electrode disposed on the insulating layer, and a semi-conducting layer disposed on the insulating layer, the source electrode and the drain electrode, wherein the semi-conducting layer is disposed to be in contact with the source electrode and the drain electrode and comprises the compound of the formula 1.

8. The organic thin film transistor according to claim 1, comprising a substrate, a gate electrode disposed on the substrate, an insulating layer disposed on the gate electrode and the substrate, a source electrode and a drain electrode disposed on the insulating layer, an organic layer disposed on the insulating layer, the source electrode and the drain electrode, and a semi-conducting layer disposed on the organic layer, wherein the organic layer is disposed to be in contact with the source electrode, the drain electrode or both the source electrode and the drain electrode and comprises the compound of the formula 1.

9. The organic thin film transistor according to claim 1, comprising a substrate, a source electrode and a drain electrode disposed on the substrate, a semi-conducting layer disposed on the substrate, the source electrode and the drain electrode, an insulating layer disposed on the semi-conducting layer, and a gate electrode disposed on the insulating layer, wherein the semi-conducting layer is disposed to be in contact with the source electrode and the drain electrode and comprises the compound of the formula 1.

10. The organic thin film transistor according to claim 1, comprising a substrate, a source electrode and a drain electrode disposed on the substrate, an organic layer disposed on the substrate, the source electrode and the drain electrode, a semi-conducting layer disposed on the organic layer, an insulating layer disposed on the semi-conducting layer, and a gate electrode disposed on the insulating layer, wherein the organic layer is disposed to be in contact with the source electrode, the drain electrode or both the source electrode and the drain electrode and comprises the compound of the formula 1.

11. The organic thin film transistor according to claim 1, comprising a substrate, a semi-conducting layer disposed on the substrate, a source electrode and a drain electrode disposed on the semi-conducting layer, an insulating layer disposed on the semi-conducting layer, the source electrode and the drain electrode, and a gate electrode disposed on the insulating layer, wherein the semi-conducting layer is disposed to be in contact with the source electrode and the drain electrode and comprises the compound of the formula 1.

12. The organic thin film transistor according to claim 1, comprising a substrate, a semi-conducting layer disposed on the substrate, an organic layer disposed on the semi-conducting layer, a source electrode and a drain electrode disposed on the organic layer, an insulating layer disposed on the organic layer, the source electrode and the drain electrode, and a gate electrode disposed on the insulating layer, wherein the organic layer is disposed to be in contact with the source electrode, the drain electrode or both the source electrode and the drain electrode and comprises the compound of the formula 1.

13. The organic thin film transistor according to claim 1, wherein the compound of the formula 1 is selected from the compounds represented by the following formula 2:

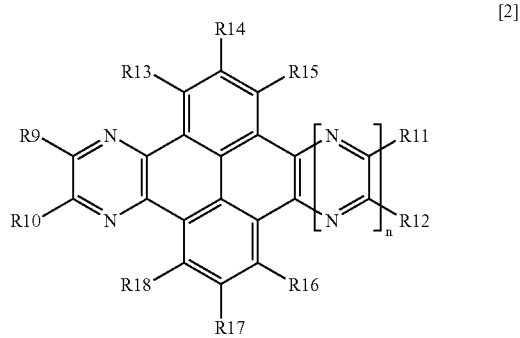

[2]

wherein n is 0 or 1,

R9 to R18 are each independently selected from the group consisting of hydrogen, a halogen group, a nitrile group (—CN), a nitro group (—$NO_2$), a sulfonyl group (—$SO_2R$), a sulfoxide group (SOR), a sulfonamide group (—$SO_2NRR'$), a sulfonate group (—$SO_3R$), a trifluoromethyl group (—$CF_3$), an ester group (—CO—OR), an amide group (—CO—NHR, —CO—NRR'), a substituted or unsubstituted straight-chained or branched $C_1$-$C_{12}$ alkoxy group, a substituted or unsubstituted straight-chained or branched $C_1$-$C_{12}$ alkyl group, a substituted or unsubstituted aromatic or non-aromatic heterocyclic group, a substituted or unsubstituted $C_6$-$C_{20}$ aryl group, a substituted or unsubstituted amine group (—NHR, —NRR'), and -L-M, and R9 and R10, or R11 and R12 may be bonded together to form an aromatic or heterocyclic ring, L is a $C_1$-$C_{60}$ alkylene group which is unsubstituted or substituted with at least one group selected from the group consisting of an amine group (—NHR, —NRR'), an amide group (—NHCOR, —CONHR, —CONRR'), an ether group (—COR) and an ester group (—COOR); a $C_6$-$C_{60}$ arylene group which is unsubstituted or substituted with at least one group selected from the group consisting of an amine group (—NHR, —NRR'), an amide group (—NHCOR, —CONHR, —CONRR'), an ether group (—COR) and an ester group (—COOR); or a 5- to 7-membered heterocyclic group which is unsubstituted or substituted with at least one group selected from the group consisting of an amine group (—NHR, —NRR'), an amide group (—NHCOR, —CONHR, —CONRR'), an ether group (—COR) and an ester group (—COOR), M is selected from the group consisting of an alcohol group (—OH), a thio group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline, and R and R' are the same or different from each other, and are each independently hydrogen, a substituted or unsubstituted $C_1$-$C_{60}$ alkyl group, a substituted or unsubstituted $C_6$-$C_{60}$ aryl group, or a substituted or unsubstituted 5- to 7-membered heterocyclic group.

14. The organic thin film transistor according to claim 1, wherein the compound of the formula 1 is selected from the compounds of the following formulae 2-1 to 2-41:

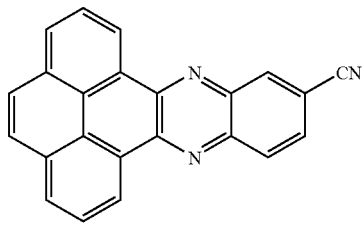
[2-1]

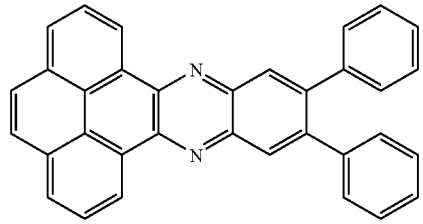
[2-2]

-continued

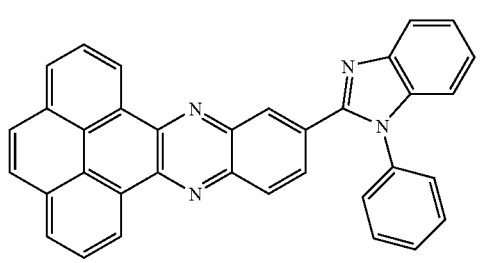
[2-3]

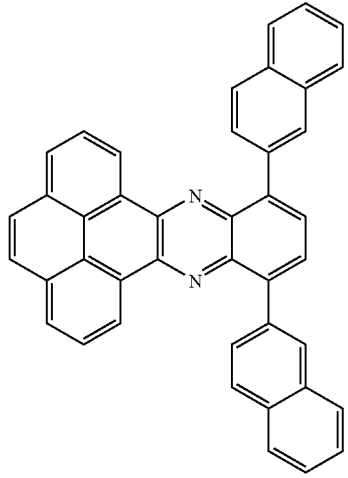
[2-4]

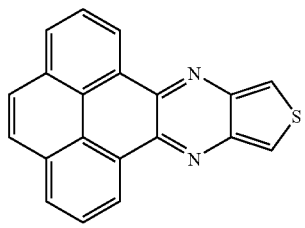
[2-5]

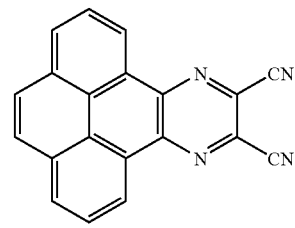
[2-6]

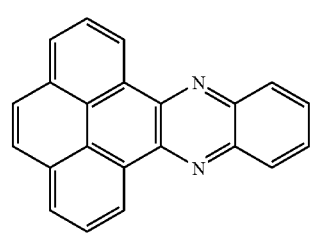
[2-7]

-continued
[2-8]
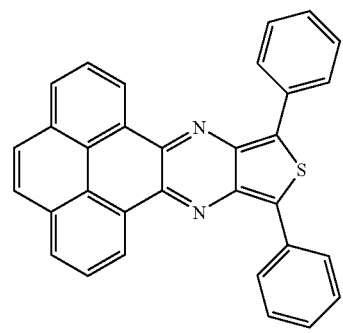
[2-9]
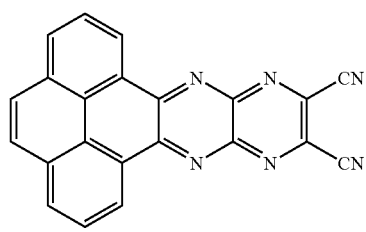
[2-10]
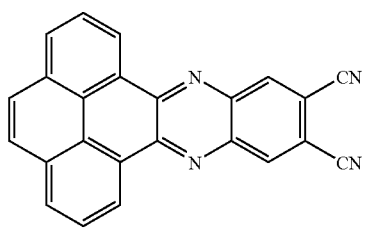
[2-11]
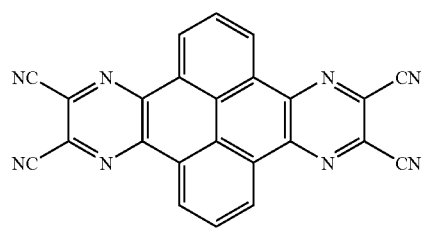
[2-12]
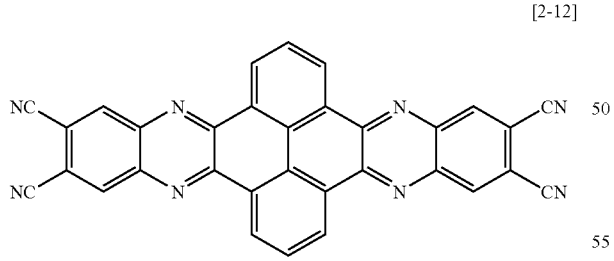
[2-13]
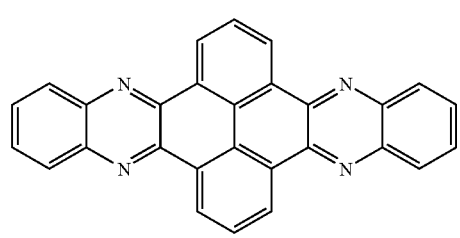
-continued
[2-14]
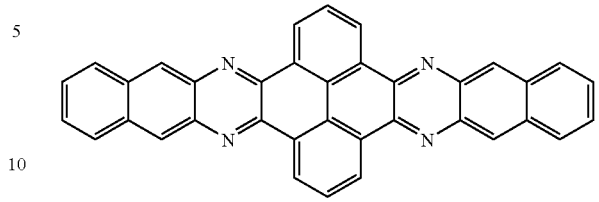
[2-15]
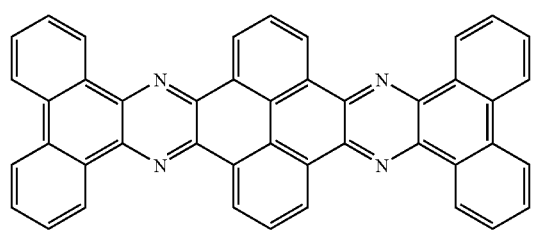
[2-16]
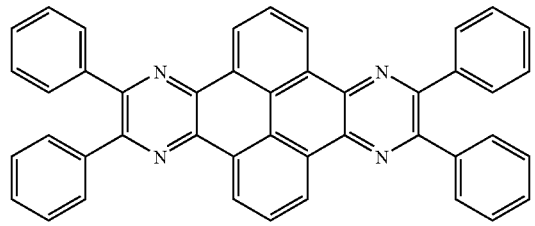
[2-17]
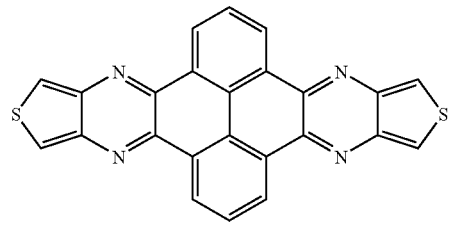
[2-18]
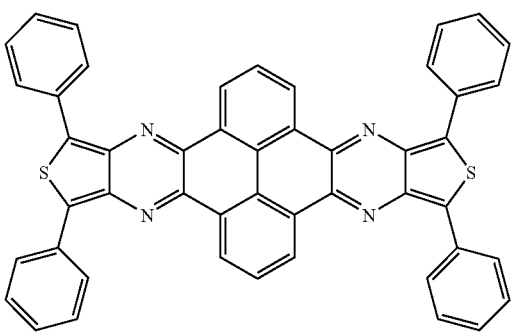
[2-19]
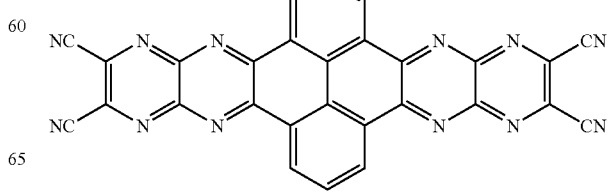

-continued
[2-20]
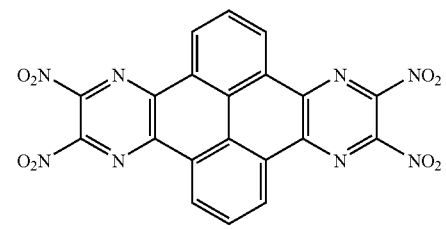
[2-21]
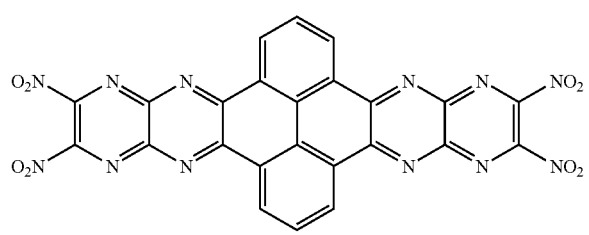
[2-22]
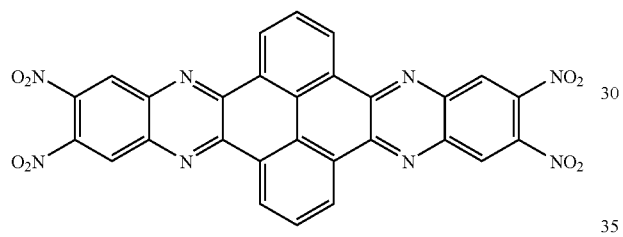
[2-23]
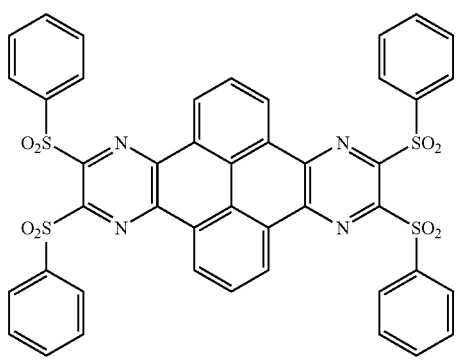
[2-24]
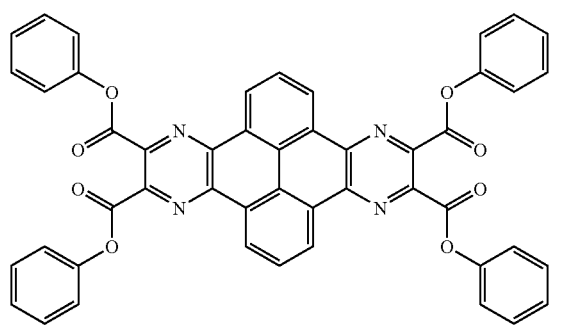
-continued
[2-25]
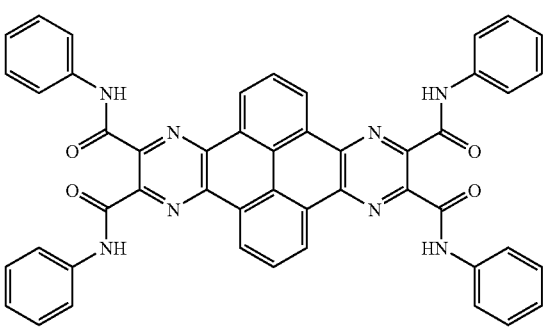
[2-26]
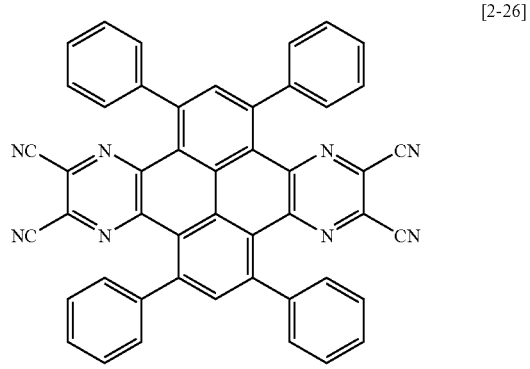
[2-27]
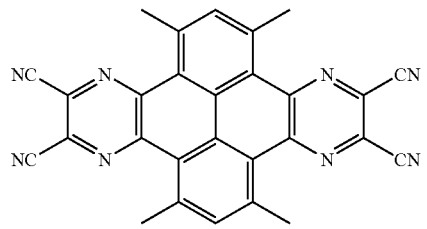
[2-28]
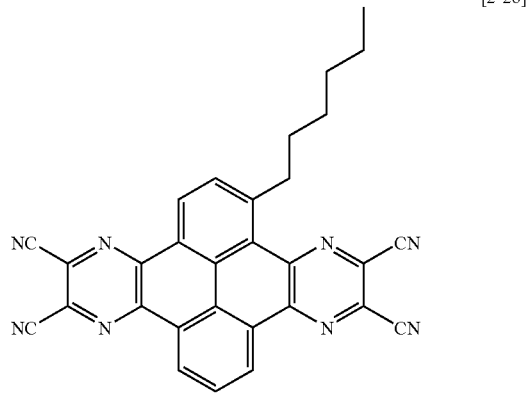

[2-29]
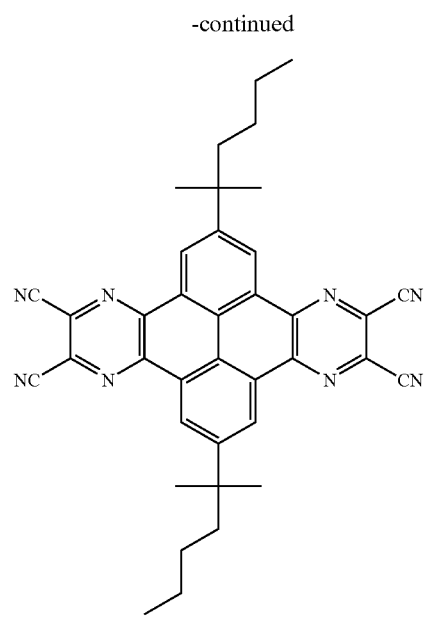
[2-30]
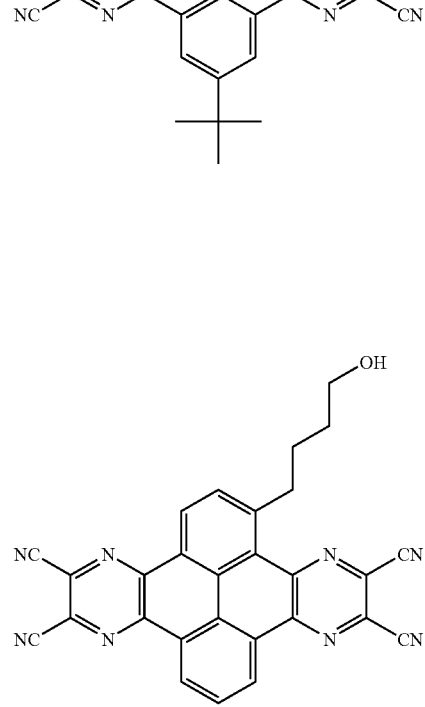
[2-31]
[2-32]
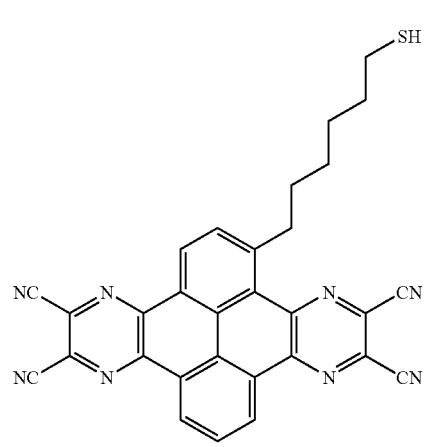
[2-33]
[2-34]
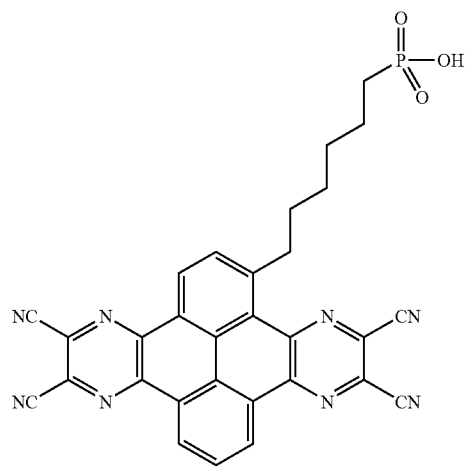

-continued
[2-35]
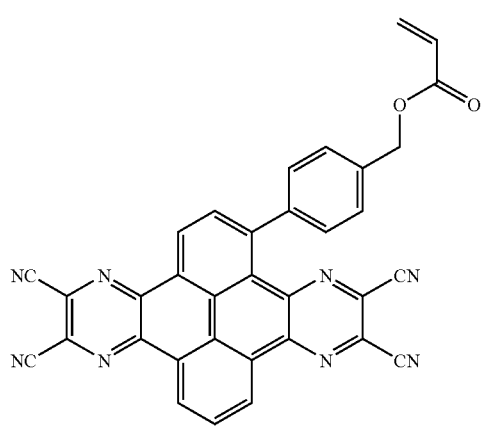
[2-36]
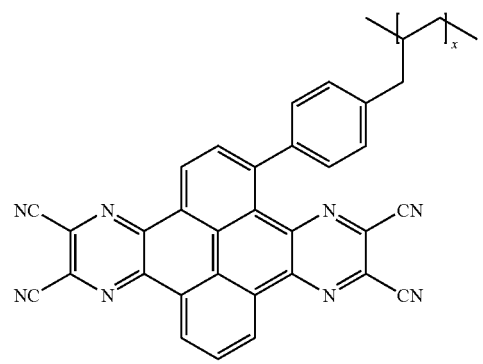
[2-37]
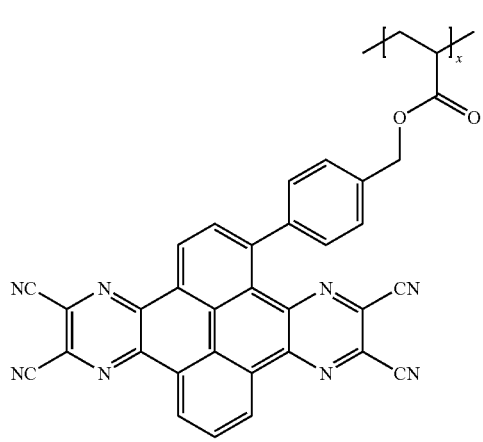
-continued
[2-38]
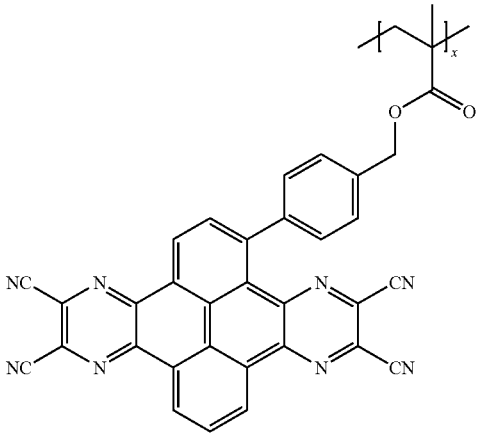
[2-39]
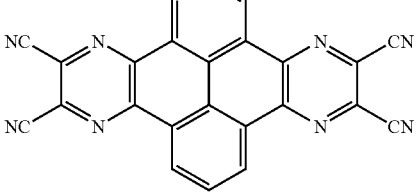
[2-40]
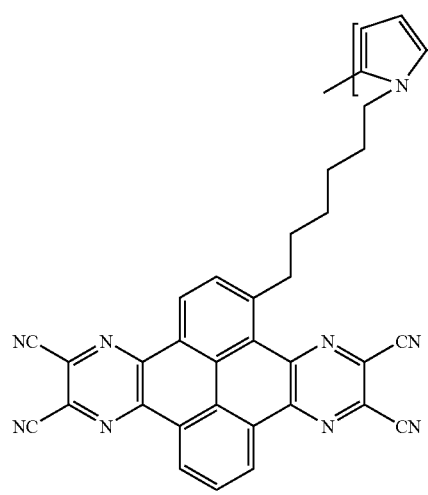

-continued

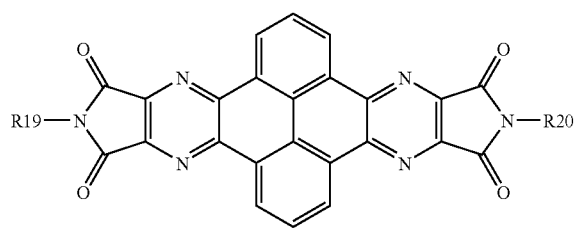

[2-41]

wherein x is 2 to 10,000,000, and R19 and R20 are each independently substituted or unsubstituted $C_1$-$C_{60}$ alkyl or substituted or unsubstituted $C_1$-$C_{60}$ aryl.

15. The organic thin film transistor according to claim 1, wherein the source electrode and the drain electrode are formed from the materials selected from aluminum, silver, gold, neodymium, palladium, platinum, and alloys of the foregoing metals.

16. An electronic device comprising the organic thin film transistor according to claim 1.

17. The electronic device according to claim 16, which is selected from E-papers, smart cards and display devices.

* * * * *